(12) United States Patent
Kanda et al.

(10) Patent No.: US 6,821,854 B2
(45) Date of Patent: Nov. 23, 2004

(54) METHOD OF MANUFACTURING A SEMICONDUCTOR INTEGRATED CIRCUIT DEVICE

(75) Inventors: Takayuki Kanda, Ome (JP); Atsushi Hiraiwa, Higashimurayama (JP); Norio Suzuki, Mito (JP); Satoshi Sakai, Ome (JP); Shuji Ikeda, Koganei (JP); Yasuko Yoshida, Sayama (JP); Shinichi Horibe, Akiruno (JP)

(73) Assignee: Renesas Technology Corp., Tokyo (JP)

( * ) Notice: Subject to any disclaimer, the term of this patent is extended or adjusted under 35 U.S.C. 154(b) by 11 days.

(21) Appl. No.: 10/211,262

(22) Filed: Aug. 5, 2002

(65) Prior Publication Data

US 2003/0003639 A1 Jan. 2, 2003

Related U.S. Application Data

(62) Division of application No. 09/536,756, filed on Mar. 28, 2000, now abandoned.

(30) Foreign Application Priority Data

Apr. 26, 1999 (JP) .......................................... 11-117815
Aug. 10, 1999 (JP) .......................................... 11-225991

(51) Int. Cl.$^7$ .......................................... H01L 21/8234
(52) U.S. Cl. ...................................................... 438/275
(58) Field of Search ................................. 438/275, 197, 438/584, 585, 599, 694, 703

(56) References Cited

U.S. PATENT DOCUMENTS 5,604,371 A * 2/1997 Kimura et al. ............... 257/378
6,071,772 A * 6/2000 Chao ........................... 438/253

* cited by examiner

Primary Examiner—Craig A. Thompson
(74) Attorney, Agent, or Firm—Antonelli, Terry, Stout & Kraus, LLP

(57) ABSTRACT

A protection film is formed on a silicon oxide film 6 formed on the surface of a semiconductor substrate, a silicon oxide film is removed from a region where a thin gate-insulating film is to be formed by using, as a mask, a photoresist pattern that covers a region where a thick gate-insulating film is to be formed, and, then, the photoresist pattern is removed followed by washing. Then, the semiconductor substrate is heat-oxidized or a film is deposited thereon to form gate-insulating films having different thicknesses.

25 Claims, 31 Drawing Sheets

FIG. 58(a)
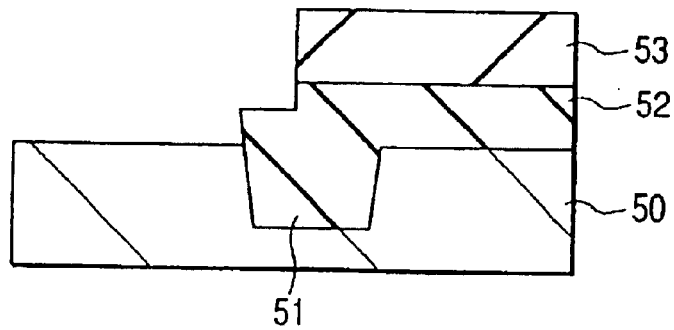
FIG. 58(b)
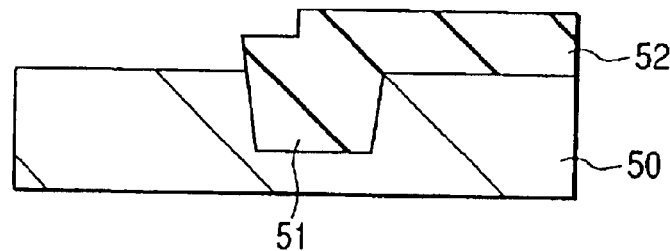
FIG. 58(c)
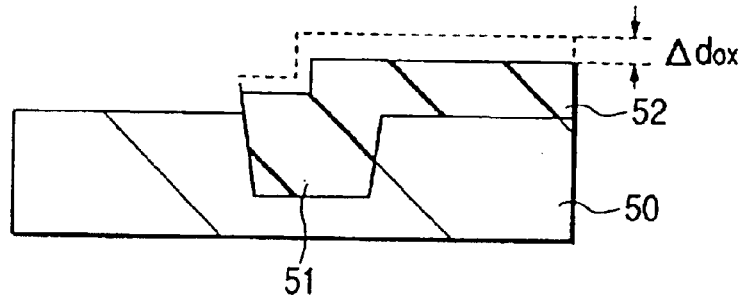
FIG.58(d)
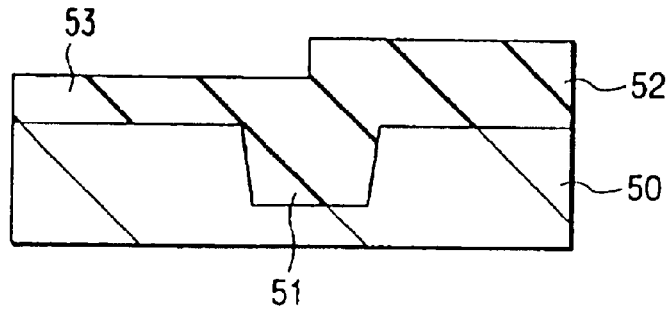

METHOD OF MANUFACTURING A SEMICONDUCTOR INTEGRATED CIRCUIT DEVICE

This application is a Divisional application of U.S. Ser. No. 09/536,756, filed Mar. 28, 2000, now ABANDONED, the contents of which are incorporated herein by reference in their entirety.

BACKGROUND OF THE INVENTION

1. Field of the Invention

The present invention relates to a method of manufacturing a semiconductor integrated circuit device. More particularly, the invention relates to technology that can be effectively adapted to a semiconductor integrated circuit device containing two kinds of MISFETs (metal insulator semiconductor field-effect transistors) to which different voltages are applied.

2. Prior Art

In a memory LSI such as CMOS (complementary metal oxide semiconductor) logic LSI (large scale integrated circuit) and SRAM (static random access memory) or DRAM (dynamic random access memory) and in a CMOS logic LSI mounting a memory circuit, the power source voltages may not often be the same between the internal circuit and the input/output circuit. In the CMOS logic LSI, for example, the length (gate length) of the gate electrodes of MISFETs in the internal circuit is set to be shorter than the gate length of MISFETs in the input/output circuit in order to increase the speed. In order to maintain a breakdown voltage of the semiconductor regions constituting the sources and drains of MISFETs in the internal circuit, however, the power-source voltage for the internal circuit is set to be lower than the power-source voltage for the input/output circuit. Here, in order to maintain reliability of the gate-insulating films of MISFETs in the input/output circuit having the high power-source voltage, the thickness of the gate-insulating films is selected to be larger than the thickness of the gate-insulating films of MISFETs in the internal circuit having the low power-source voltage.

Two kinds of gate-insulating films having different thicknesses are formed on a semiconductor substrate of silicon by, first, forming element isolation regions on the main surface of the semiconductor substrate and, then, subjecting the semiconductor substrate to the heat oxidation treatment of the first time to form a silicon oxide film on the surface of the semiconductor substrate. Next, active regions where the thick gate-insulating film will be formed are covered with a photoresist film, the silicon oxide film on the active regions on where the thin gate-insulating film will be formed is removed by wet etching and, then, the photoresist film is removed, followed heat-oxidizing the semiconductor substrate in the second time. That is, the thin gate-insulating film is formed through the heat oxidation of the second time, and the thick gate-insulating film is formed through the heat oxidation of the first time and through the heat oxidation of the second time.

SUMMARY OF THE INVENTION

Through their study, however, the present inventors have discovered the fact that according to the above-mentioned method of forming two kinds of gate-insulating films of different thicknesses, the active regions on where the thick gate-insulating film is to be formed is covered with the photoresist film at the time of removing, by wet etching, the silicon oxide film from the active regions on where the thin gate-insulating film is to be formed. Therefore, the thin gate-insulating film, thick gate-insulating film or these two gate-insulating films lose breakdown voltage due to contamination caused by the photoresist film and due to any damage in the step of removing the photoresist film and in the subsequent step of washing.

The object of the present invention is to provide technology capable of improving reliability of the semiconductor integrated circuit device containing a plurality of kinds of MISFETs having gate-insulating films of different thicknesses.

The above and other objects as well as novel features of the invention will become obvious from the description of the specification and the accompanying drawings.

Briefly described below are representative examples of the invention disclosed in this application.

That is, the invention is concerned with a process for forming two kinds of gate-insulating films, wherein a first insulating film is formed by etching, using a photoresist film as a mask, on a region of a semiconductor substrate on where an insulating film of a first relatively large thickness is to be formed and, then, a second insulating film is formed on the first insulating film in order to prevent the first insulating film from being scraped off in the step of washing which precedes the processing for forming an insulating film of a second relatively small thickness.

Further, the invention is concerned with a process for forming two kinds of gate-insulating films, wherein a first insulating film is formed by etching, using a photoresist film as a mask, on a region of a semiconductor substrate on where an insulating film of a first relatively large thickness is to be formed and, then, a second insulating film that has been formed in advance on the first insulating film is used as an etching stopper in the step of washing which precedes the processing for forming an insulating film of a second relatively small thickness.

Other representative examples of the invention disclosed in the application are as described below briefly.

A method of manufacturing a semiconductor integrated circuit device by forming an insulating film of a first thickness on a first active region of a semiconductor substrate and forming an insulating film of a second thickness smaller than the first thickness on a second active region is provided. This method includes the steps of:

(a) forming a first insulating film on the surface of the semiconductor substrate;
(b) forming a second insulating film which is a protection film on said the first insulating film;
(c) covering the first active region with a masking pattern;
(d) successively removing the second insulating film and the first insulating film from the second active region by using the masking pattern as a mask;
(e) selectively removing chiefly the second insulating film formed from the first active region after the masking pattern has been removed; and
(f) forming a third insulating film on the semiconductor substrate.

A method of manufacturing a semiconductor integrated circuit device by forming an insulating film of a first thickness on a first active region of a semiconductor substrate and forming an insulating film of a second thickness smaller than the first thickness on a second active region is also provided. This method includes the steps of:

(a) forming a first insulating film on the surface of the semiconductor substrate;
(b) forming a second insulating film which is a protection film on the first insulating film after the surface of the first insulating film has been removed by not more than about 1 nm;
(c) covering the first active region with a masking pattern;
(d) successively removing the second insulating film and the first insulating film from the second active region by using the masking pattern as a mask;
(e) selectively removing the second insulating film from said first active region after the masking pattern has been removed; and
(f) forming a third insulating film on the semiconductor substrate.

A method of manufacturing a semiconductor integrated circuit device is provided. This method includes the steps of:

(a) forming a first insulating film on the surface of a semiconductor substrate;
(b) forming a second insulating film which is a protection film on the first insulating film;
(c) forming a masking pattern on the semiconductor substrate so as to cover a first region on which an insulating film having a relatively large thickness will be formed but not covering a second region on which an insulating film having a relatively small thickness will be formed other than the first region;
(d) successively removing the second insulating film and the first insulating film from the second active region by using the masking pattern as a mask;
(e) after the masking pattern has been removed, removing the second insulating film by washing the semiconductor substrate, the second insulating film being used for suppressing the first insulating film from being scraped off; and
(f) forming a third insulating film on the semiconductor substrate in order to form an insulating film of a first relatively large thickness on the first region and to form an insulating film of a second relatively small thickness on the second region.

A further method of manufacturing a semiconductor integrated circuit device is provided. This method includes the steps of:

(a) forming a first insulating film on the surface of a semiconductor substrate having a first active region and a second active region;
(b) forming a second insulating film which is a protection film on the first insulating film;
(c) successively removing the second insulating film and the first insulating film from the second active region;
(d) washing the semiconductor substrate after step (c); and
(e) forming a third insulating film on the semiconductor substrate after step (d), to form an insulating film of a first relatively large thickness on the first active region and to form an insulating film of a second relatively small thickness on the second active region;
wherein in effecting the washing in step (d), the rate for etching the second insulating film is larger than the rate for etching the first insulating film, and the second insulating film is removed from the second active region.

Another method of manufacturing a semiconductor integrated circuit device is provided. This method includes the steps of:

(a) forming a first insulating film on the surface of a semiconductor substrate;
(b) forming a second insulating film which is a protection film on the first insulating film;
(c) forming a masking pattern on the semiconductor substrate so as to cover a first region on which an insulating film having a relatively large thickness will be formed but not covering a second region on which an insulating film having a relatively small thickness will be formed other than the first region;
(d) successively removing the second insulating film and the first insulating film from the second active region by using the masking pattern as a mask;
(e) after the masking pattern has been removed, washing the semiconductor substrate using the second insulating film as a stopper; and
(f) forming a third insulating film on the semiconductor substrate in order to form an insulating film of a first relatively large thickness on the first region and to form an insulating film of a second relatively small thickness on the second region.

In forming a plurality of kinds of gate insulating films having different thicknesses according to the above-mentioned means, the photoresist pattern is not directly formed on the first insulating film that constitutes a relatively thick gate-insulating film but, instead, the photoresist pattern is formed via the second insulating film or via a reformed layer of the first insulating film. Therefore, contaminants from the photoresist film adhere on the second insulating film or on the reformed layer of the first insulating film. As the first insulating film, there is used a film formed by heat-treating the semiconductor substrate, a film formed by the chemical vapor-phase deposition method, or a film formed by nitriding the film that has been formed by the chemical vapor-phase deposition method. As the second insulating film, there is used a film formed by, for example, the chemical vapor-phase deposition method which is different from the method of forming the first insulating film. This enables the second insulating film in the washing solution to be etched at a rate larger than the rate of etching the first insulating film. By selectively removing the second insulating film by utilizing the difference in the etching rate, therefore, the first insulating film is not affected by the contamination caused the resist and, besides, damage to the first insulating film can be avoided in the step of removing the resist and in the subsequent washing step. By removing the surface portion of the first insulating film within such a degree that no defect develops in the film, further, it is allowed to remove contaminants adhered on the interface between the first insulating film and the second insulating film, contributing to further improving reliability of the gate-insulating film.

According to the above means, further, in effecting the washing prior to forming the insulating film of the relatively small second thickness, the second insulating film prevents the first insulating film from being scraped off on the region on where the insulating film of the relatively large first thickness is formed, so that weak spots in the first insulating film will not be exposed and that fine pores will not be formed. Therefore, the gate-insulating film having the relatively large first thickness is suppressed or prevented from losing breakdown voltage, and the quality of the gate-insulating film can be improved.

According to the above means, further, in effecting the washing prior to forming the insulating film of the relatively small second thickness, the second insulating film formed in advance on the first insulating film on the region on where the insulating film of the relatively large first thickness has been formed, works as an etching stopper so that the first insulating film is not scraped off, weak spots in the first insulating film will not be exposed and that fine pores will not be formed. Therefore, the gate-insulating film having the relatively large first thickness is prevented from losing the breakdown voltage that stems when the first insulating film is scraped off during the washing, and improved quality of the gate-insulating film can be maintained.

BRIEF DESCRIPTION OF THE DRAWINGS

FIG. 9 is a graph showing a relationship between the defect density and the breakdown electric field intensity of the silicon oxide film on the side of the thin-film portion of when the silicon oxide film on the thin-film portion is scraped off by about 1 nm through the pre-washing, and wherein

FIGS. 58(a) to 58(d) are sectional views of a major portion of a semiconductor substrate in a process for forming two kinds of gate-insulating films studied by the present inventors for embodying the invention.

DESCRIPTION OF THE PREFERRED EMBODIMENTS

Figure 1A:
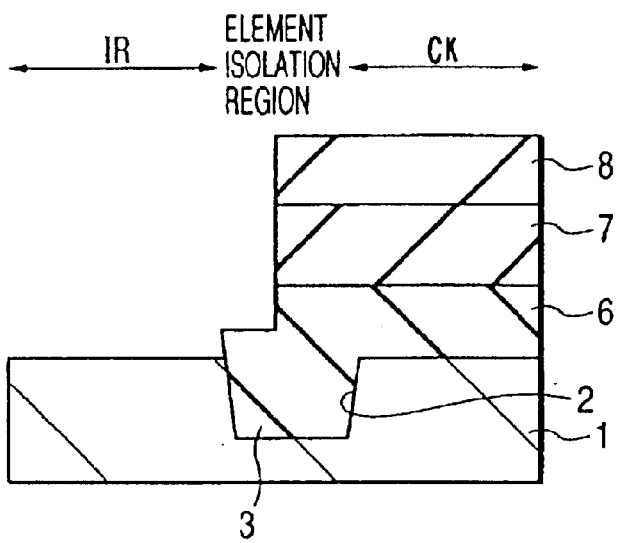
FIGS. 1(a) to 1(d) are sectional views illustrating a major portion of a semiconductor substrate in the steps of manufacturing a semiconductor integrated circuit device according to a technical idea of the invention.

Embodiments of the present invention will now be described in detail with reference to the drawings.

In all drawings explaining the embodiments, the portions having the same functions are denoted by the same reference numerals but their description is not repeated.

Embodiment 1

Prior to describing the embodiment 1, mentioned below are a process for forming two kinds of gate-insulating films and the assignment therefor discussed by the present inventors for accomplishing the invention. In the drawings, the left side is a region (thin-film portion) IR forming an MISFET having a thin gate-insulating film and the right side is a region (thick-film portion) CR forming a MISFET having an thick gate-insulating film.

FIG. 58(a) is a partial sectional view of a semiconductor substrate 50 in a step of manufacture. First, a groove is formed in the semiconductor substrate 50, an insulating film of silicon oxide or the like is buried in the groove, and a groove-type isolation portion 51 is formed on the main surface of the semiconductor substrate 50. Then, the semiconductor substrate 50 is heat-oxidized to form a first silicon oxide film 52 on the main surface (active region) of the semiconductor substrate 50, a photoresist film 53 is formed in a manner of directly contacted onto the silicon oxide film 52 so as to cover the thick-film portion CK but permitting the thin-film portion to be exposed, and the first silicon oxide film 52 is removed from the thin-film portion IR using the photoresist film 53 as an etching mask.

Then, the photoresist film 53 is removed by ashing to obtain a sectional structure shown in FIG. 58(b). Then, the washing is effected. The washing includes, for example, a first washing treatment (SC1) and a second washing treatment (SC2). The first washing treatment (SC1) is chiefly for removing foreign matter and, for example, $NH_3/H_2O_2$ is used as a washing solution. The second washing treatment (SC2) is chiefly for removing metals and, for example, $HCl/H_2O_2$ is used as a washing solution.

Thereafter, the whole semiconductor substrate 50 inclusive of the main surface is pre-washed. The pre-washing is an important treatment for reducing or eliminating damage at the time of removing the spontaneously oxidized film or the photoresist film formed on the main surface of, for example, the thin-film portion on the semiconductor substrate 50, and for reducing or eliminating contamination in the first silicon oxide film on the thick-film portion CK caused by the photoresist film. According to the study by the present inventors, it was discovered that when it is presumed that the silicon oxide film exists on the thin-film portion IR, the pre-washing is necessary for removing the silicon oxide film by a thickness of, for example, not less than 1 nm and, desirably, by about 2 nm from the standpoint of improving reliability. According to technology discussed by the present inventors, the first washing and the third washing (DHF) are effected in the pre-washing treatment. The third washing (DHF) is for chiefly removing the spontaneously oxidized film and, for example, hydrofluoric acid is used as the washing solution. When the pre-washing is effected, the upper portion of the first silicon oxide film 52 on the thick-film portion CK is scraped off as shown in FIG. 58(c). Symbol Δdox represents the amount of the silicon oxide film 52 scraped off.

After the pre-washing, the semiconductor substrate 50 is subjected to a second heat-oxidation treatment thereby to form a second silicon oxide film 53 on the thin-film portion of the semiconductor substrate 50 as shown in FIG. 58(d) and to form the first silicon oxide film 52 on the thick-film portion CK maintaining a thickness larger than that of the second silicon oxide film 53 on the thin-film portion IR. Thereafter, gate electrodea are formed on the first and second silicon oxide films in the same manner as that of forming an ordinary field-effect transistor.

In carrying out the above process for forming two kinds of gate-insulating films, the present inventors have discovered the following assignment based on the experimental results. That is, in conducting the pre-washing, the upper part of the first silicon oxide film 52 is scraped off, weak spots considered to be existing in the first silicon oxide film 52 are exposed and are further expanded to form very fine pores. When the gate electrode is formed on the first silicon oxide film 52 that has been completed, the fine pores are further expanded due to stress produced by the gate electrode. Then, the quality of the first silicon oxide film 52 that requires a high breakdown voltage is deteriorated, and the breakdown voltage is no longer maintained.

In this invention, therefore, another insulating film is interposed between the silicon oxide film on the thick-film portion CK that requires the large breakdown voltage and the photoresist film for patterning the silicon oxide film in the process for forming two kinds of gate-insulating films. This makes it possible to greatly decrease the scraping amount of the silicon oxide film on the thick-film portion CK during the pre-washing. Accordingly, weak spots considered to be existing in the silicon oxide film on the thick-film portion CK are suppressed or preventing from being exposed. Further, since the photoresist film does not come into direct contact with the silicon oxide film on the thick-film portion CK, the silicon oxide film on the thick-film portion CK is little contaminated or is not contaminated by the photoresist film. Moreover, another insulating film is formed on the silicon oxide film on the thick-film portion CK under the photoresist film. At the time of removing the photoresist film, therefore, the underlying film (silicon oxide film on the thick-film portion) is little damaged.

The technical idea of the invention will now be described with reference to FIGS. 1(a) to 1(d) which are sectional views illustrating a major portion of a semiconductor substrate at the same position.

Referring, first, to FIG. 1(a), a shallow groove 2 is engraved in a semiconductor substrate 1, and a silicon oxide film 3 or the like film is buried in the shallow groove 2 to form, for example, a groove-type element isolation region (trench isolation) on the main surface of the semiconductor substrate 1. Then, the semiconductor substrate 1 is heat-oxidized to form a silicon oxide film 6 on the main surface (active region) of the semiconductor substrate 1, and a silicon oxide film 7 is formed as a protection film in a manner of being directly contacted to the silicon oxide film 6 by, for example, the CVD (chemical vapor deposition) method. Then, a photoresist pattern (masking film, masking pattern) is formed thereon being directly contacted thereto so as to cover the thick-film portion CK but permitting the thin-film portion to be exposed. By using the photoresist pattern 8 as an etching mask, further, the silicon oxide film 6 and the protection film 7 are removed from the thin film portion IR.

Figure 1B:
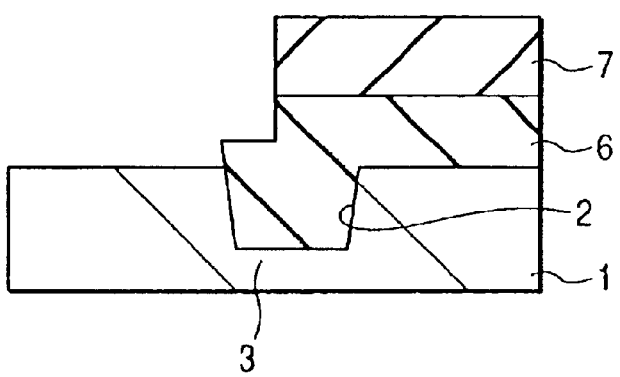

Then, the photoresist pattern 8 is removed by ashing to obtain a sectional structure as shown in FIG. 1(b). At this moment, the silicon oxide film 7 which is a protection film has been formed on the silicon oxide film 6 under the photoresist pattern 8, and the silicon oxide film 6 is little damaged. The washing treatment is effected. In washing the back surface, the first washing (SC1) and the second washing (SC2) are effected. The first washing and the second washing are the same as those employed for the process for forming two kinds of gate-insulating films discussed by the present inventors, and are not described here again.

Next, the whole semiconductor substrate 1 inclusive of the main surface is subjected to the pre-washing (first washing and third washing (DHF)) like in the process for forming two kinds of gate-insulating films discussed by the present inventors. This makes it possible to reduce or eliminate damage at the time of removing the spontaneously oxidized film or removing the photoresist film formed on the main surface of, for example, the thin-film portion IR of the semiconductor substrate 1. According to the technical idea of the invention, the silicon oxide film 6 on the thick-film portion CK does not come in direct contact with the photoresist pattern 8, and the silicon oxide film 6 is little contaminated or is not contaminated by the photoresist film. In conducting the pre-washing, therefore, much consideration needs not be given to the contamination of the silicon oxide film 6 by the photoresist film.

Figure 1C:
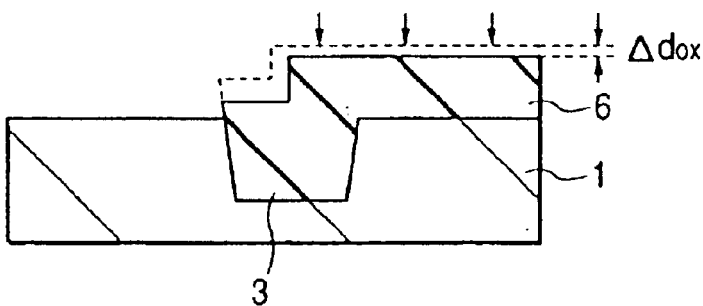

Upon effecting the pre-washing, the silicon oxide film 7 can be chiefly removed by etching, since the silicon oxide film 7 which is the protection film formed the CVD method is etched at a rate larger than a rate at which the silicon oxide film 6 formed by the heat-oxidation is etched. In this pre-washing, too, the upper part of the silicon oxide film 6 on the thick-film portion CK is scraped off by about $\Delta$dox as shown in FIG. 1(c). In this case, however, the scraping amount can be suppressed to be very small so that the weak spots will not be exposed. It is, therefore, made possible to maintain the breakdown voltage of the gate-insulating film on the thick-film portion that requires the large breakdown voltage.

Figure 1D:
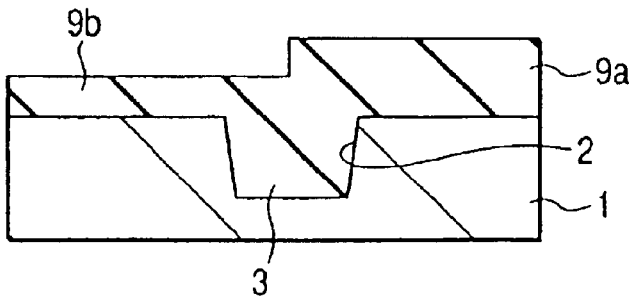

After the pre-washing, the semiconductor substrate 1 is subjected to the second heat-oxidation treatment to form a silicon oxide film 9a having a relatively large thickness on the thick-film portion CK and to form a silicon oxide film 9b having a relatively small thickness on the thin-film portion IR as shown in FIG. 1(d). The silicon oxide films 9a and 9b are used as gate-insulating films of the field-effect transistor. Then, the gate electrode is formed on the silicon oxide films 9a and 9b in the same manner as that of forming an ordinary field-effect transistor.

Figure 2A:
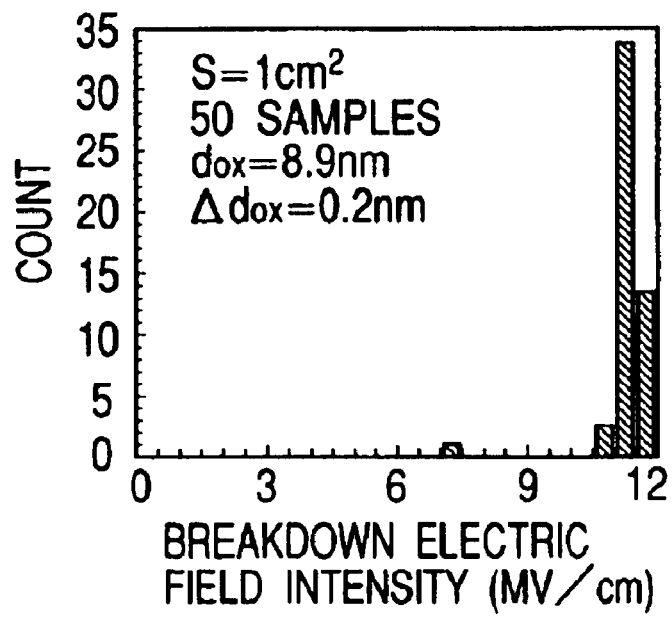
FIGS. 2(a) and 2(b) are graphs showing the measured results of breakdown voltages of a silicon oxide film 9a based on a process for forming two kinds of gate-insulating films according to the technical idea of the invention.
Figure 2B:
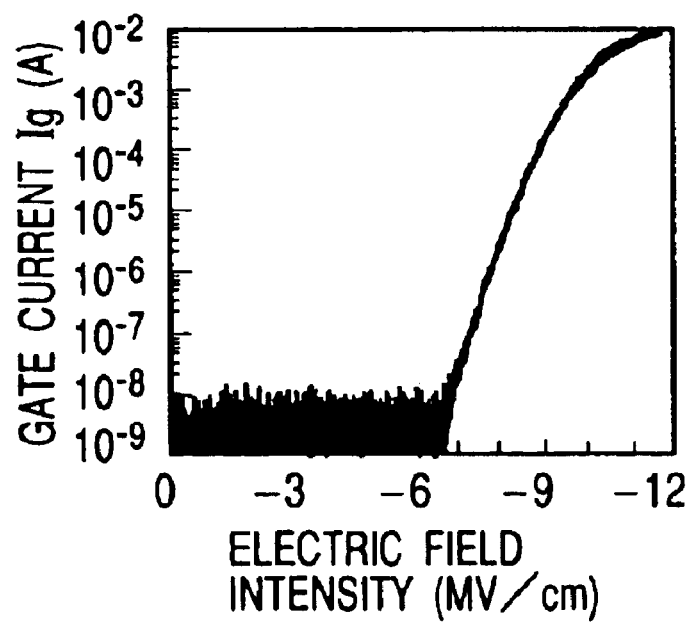
Figure 3A:
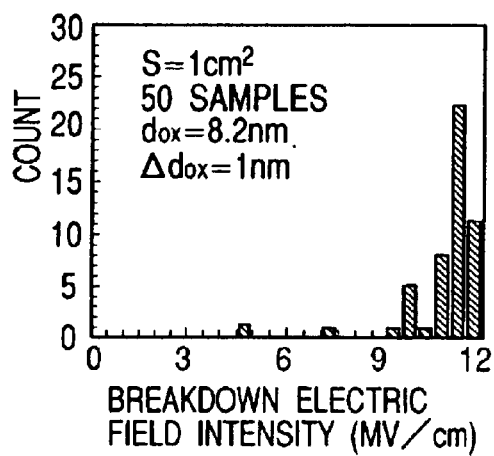
FIGS. 3(a) to 3(d) are graphs comparing the measured results of breakdown voltage of a silicon oxide film 52 based on the process for forming two, kinds of gate-insulating films studied by the inventors.
Figure 3B:
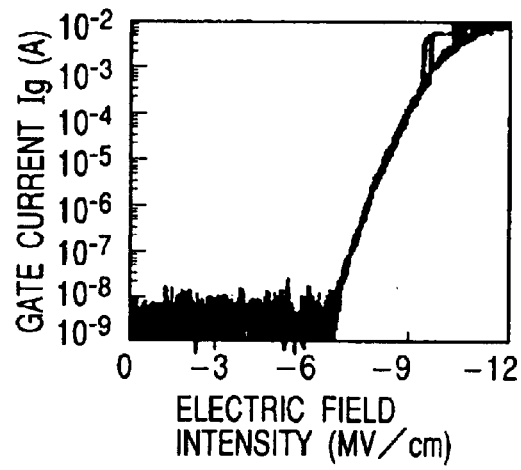
Figure 3C:
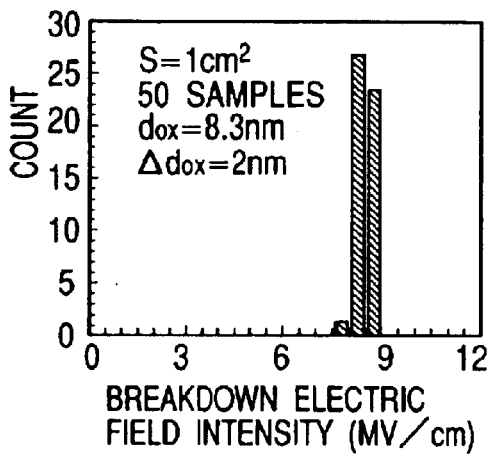
Figure 3D:
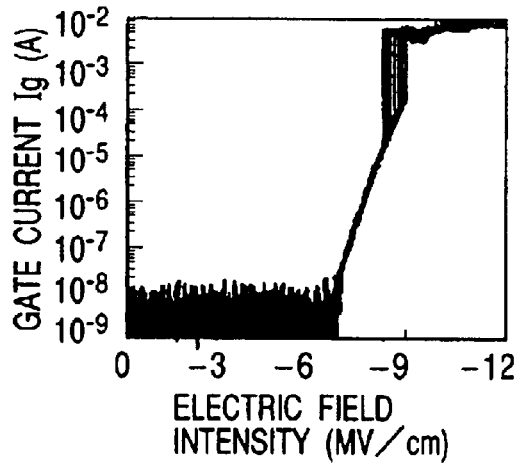
Figure 4A:
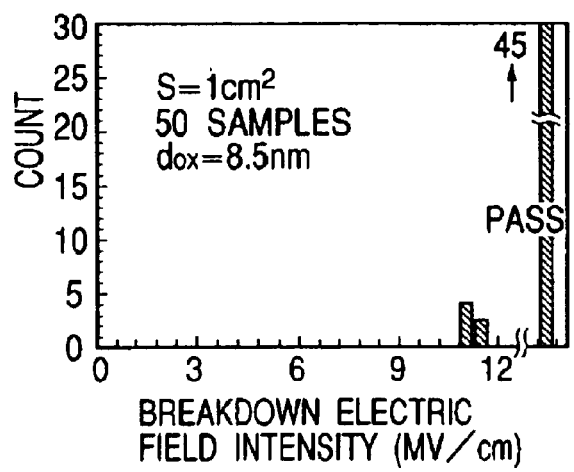
FIGS. 4(a) and 4(b) are graphs comparing the measured results of breakdown voltage of the silicon oxide film formed by a process for forming one kind of gate-insulating film.
Figure 4B:
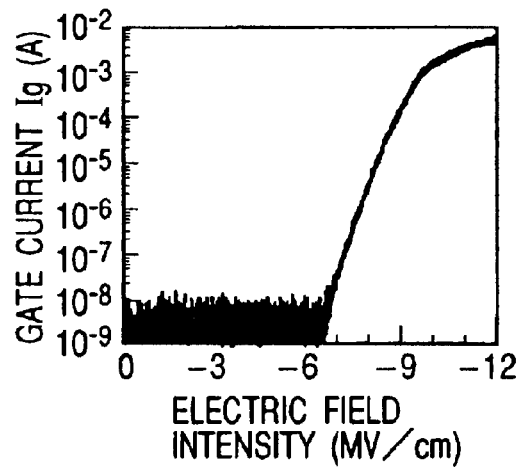

FIGS. 2(a) and 2(b) show the measured results of breakdown voltage of the silicon oxide film 9a of when there is employed the process for forming two kinds of gate-insulating films of the technical idea of the invention shown in FIG. 1. For the purpose of comparison, further, FIGS. 3(a), 3(b), 3(c) and 3(d) show the measured results of breakdown voltage of the silicon oxide film 52 of when there is employed the process for forming two kinds of gate-insulating films discussed by the present inventors shown in FIG. 58. FIGS. 3(a) and 3(b) show the results of when the silicon oxide film 6 is scraped off by $\Delta$dox=1 nm, and FIGS. 3(c) and 3(d) show the results of when $\Delta$dox=2 nm. From FIG. 3, it can be said that the silicon oxide film 9a exhibits better breakdown voltage when the scraping amount $\Delta$dox of the silicon oxide film 6 is small. For the purpose of comparison, further, FIGS. 4(a) and 4(b) show the measured results of breakdown voltage of the silicon oxide film formed by the process for forming one kind of gate-insulating film. In FIGS. 2(a), 3(a), 3(c) and 4(a), the abscissas represent the breaking electric field intensity of the silicon oxide film formed on the thick-film portion, and the ordinates represent the count of defects. In FIGS. 2(b), 3(b), 3(d) and 4(b), further, the abscissas represent the electric field intensity of the silicon oxide film formed on the thick-film portion and the ordinates represent the gate current flowing between the gate electrode and the semiconductor substrate.

Here, the polycrystalline silicon film and the tungsten silicide film are successively formed on the silicon oxide films 9a and 52, and a capacitor is so formed by using an exclusive photomask that the areas S of the silicon oxide films 9a and 52 are 1 cm$^2$ each. The silicon oxide film 9a has a thickness $\Delta$dox of, for example, about 8.9 nm and its scraping amount $\Delta$dox is, for example, about 1 nm. Further, the silicon oxide film 52 has a thickness dox of, for example, from about 8.2 to 8.3 nm and its scraping amount $\Delta$dox is, for example, from about 1 to 2 nm. The silicon oxide film formed by the process for forming one kind of gate-insulating film has a thickness dox of, for example, about 8.5 nm. As will be understood from FIGS. 2 to 4, by using the technical idea of the invention, the breakdown voltage of the silicon oxide film 9a can be increased to be nearly equal to that of the silicon oxide film formed by the process for forming one kind of gate-insulating film. That is, when the technical idea of the invention is employed as shown in FIG. 2, the scraping amount $\Delta$dox of the thick-film portion can be decreased (to about 0.2 nm) as compared with the process shown in FIG. 58. According to the technical idea of the invention, therefore, it is allowed to suppress or prevent weak spots in the silicon oxide film 6 from being exposed during the pre-washing, and the weak spots are further suppressed or prevented from expanding into fine pores. Thus, the silicon oxide film 9a on the thick-film portion maintains improved quality.

Figure 5:
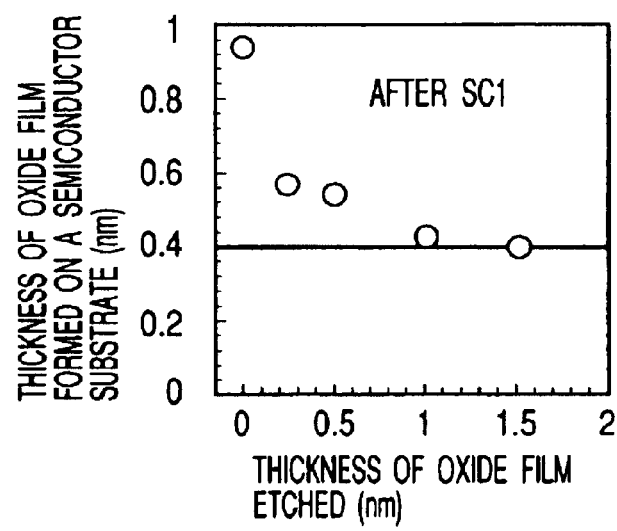
FIG. 5 is a diagram drawing the experimental results conducted by the present inventors, and shows a relationship between the etching amount (equivalent to washing time) in the direction of thickness of the silicon oxide film on the thin-film portion after the washing and the thickness of the silicon oxide film remaining on the semiconductor substrate.

FIG. 5 is a diagram showing the experimental results obtained by the inventors, i.e., showing a relationship between the etching amount (equivalent to washing time) in the direction of thickness of the silicon oxide film on the thin-film portion after the pre-washing (first washing SC1) and the thickness of the silicon oxide film left on the semiconductor substrate. When it is presumed that a silicon oxide film exists on the thin-film portion, it will be understood from FIG. 5 that the above pre-washing must be effected to such a degree as to remove the silicon oxide film by, for example, not less than 1 nm and, preferably, about 2 nm to improve reliability.

Figure 6:
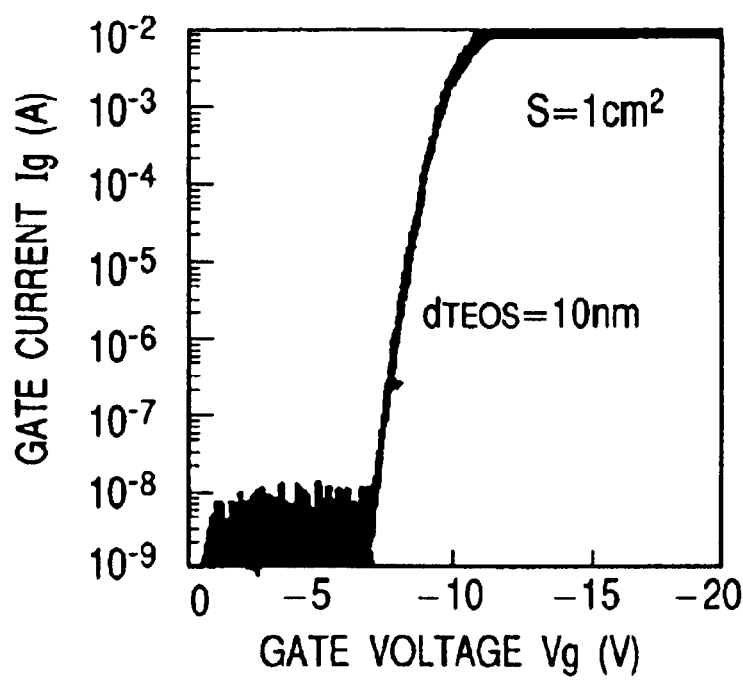
FIG. 6 is a graph showing the measured results of a relationship (I–V characteristics) between the gate current and the gate voltage according to the technical idea of the invention.
Figure 7:
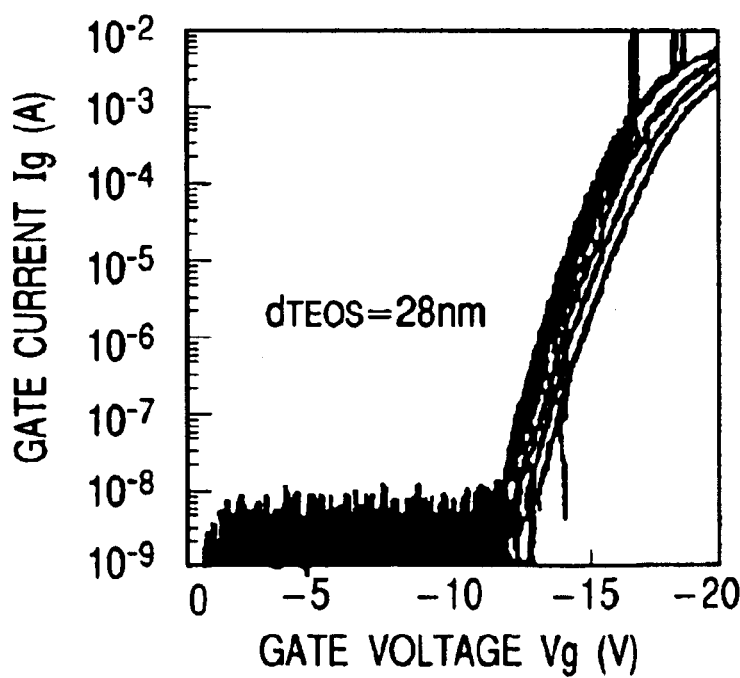
FIG. 7 is a graph corresponding to FIG. 6 and shows the measured results of a relationship (I–V characteristics) between the gate current and the gate voltage according to technology studied by the present inventors.

FIGS. 6 and 7 illustrate the measured results of a relationship (I–V characteristics) between the gate current and the gate voltage of when the silicon oxide film 7 is not left on the silicon oxide film 6 (technical idea of the invention) and when the silicon oxide film 7 is left on the silicon oxide film 6. In FIG. 6 where the silicon oxide film 7 is not left on the silicon oxide film 6, there is no change in the I–V characteristics. In FIG. 7 where the silicon oxide film 7 is left on the silicon oxide film 6, on the other hand, the I–V characteristics undergo a variation, and the field-effect transistor loses the operation stability. It is therefore desired not leave the silicon oxide film 7.

Figure 8:
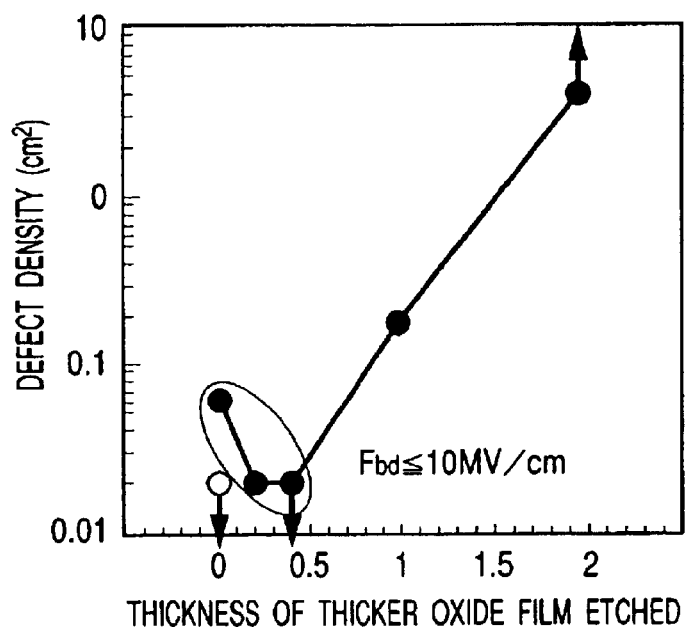
FIG. 8 is a graph illustrating a relationship between the defect density and the etched amount of the silicon oxide film on the thick-film portion through the pre-washing.

FIG. 8 illustrates a relationship between the defect density and the scraping amount of the silicon oxide film on the thick-film portion due to etching during the pre-washing. Black circles represent points of measuring the defect density of the silicon oxide film on the thick-film portion formed by the process for forming two kinds of gate-insulating films according to the technical idea of the invention, and an open circle represents a point of measuring the defect density of the silicon oxide film formed by the process for forming one kind of gate-insulating film. As will be understood from FIG. 8, the process of the invention makes it possible to substantially decrease the scraping amount of the silicon oxide film 6 by etching and, hence, to decrease the defect density. According to the study by the inventors, it is desired that the scraping amount is not larger than 1 nm and, preferably, from about 0.2 to about 0.5 nm. That is, according to the invention, the scraping amount of the silicon oxide film on the thick-film portion can be decreased to be not larger than 1 nm and, hence, to improve reliability of the gate-insulating film on the thick-film portion.

Figure 9A:
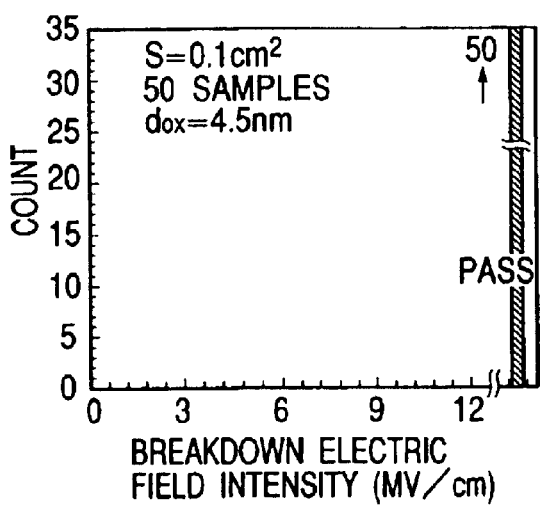
FIG. 9(a) shows a case of when there is employed a process for forming one kind of gate-insulating film.
Figure 9B:
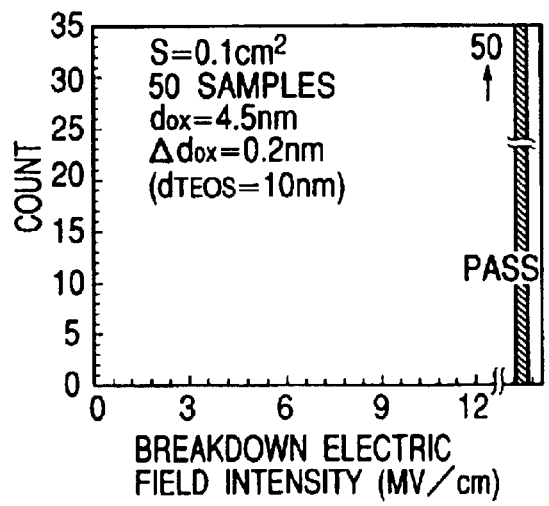
FIG. 9(b) shows a case of when there is employed a process for forming two kinds of gate-insulating films according to the technical idea of the invention.

FIG. 9 illustrates a relationship between the count of defects and the breaking electric field intensity of the silicon oxide film on the side of the thin-film portion when the silicon oxide film is scraped by a thickness of about 1 nm through the pre-washing, wherein FIG. 9(a) illustrates the case of the process for forming one kind of gate-insulating film and FIG. 9(b) illustrates the case of the process for forming two kinds of gate-insulating films according to the technical idea of the invention. When the technical idea of the invention is employed concerning the breakdown electric field intensity of the silicon oxide film on the thick-film portion as will be understood from FIG. 9, the result becomes comparable to that of when the process for forming one kind of gate-insulating film is employed.

Figure 10A:
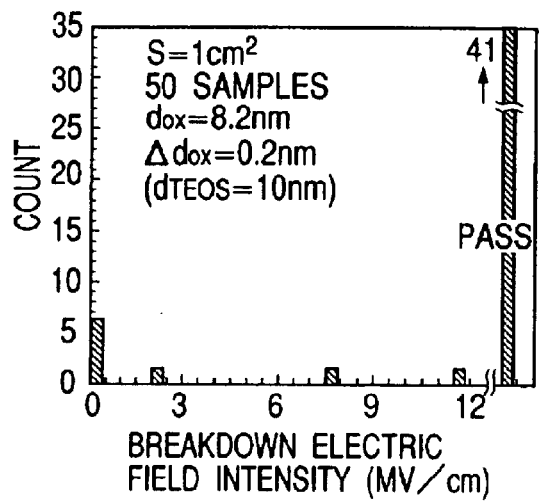
FIGS. 10(a) and 10(b) are graphs showing the measured results of breakdown voltage of the silicon oxide film constituting the gate-insulating film on the thick-film portion of when the technical idea of the invention is adapted to the salicide process.
Figure 10B:
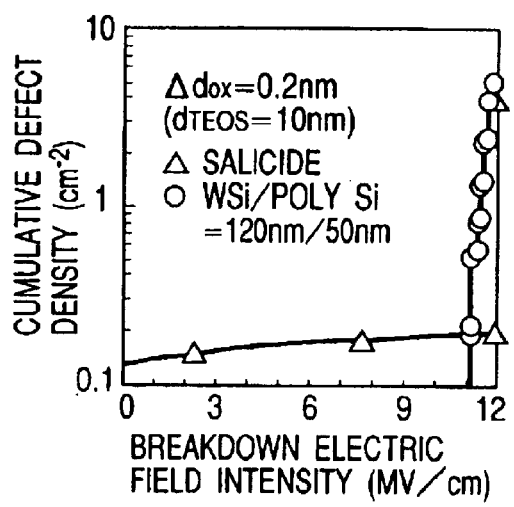
Figure 11A:
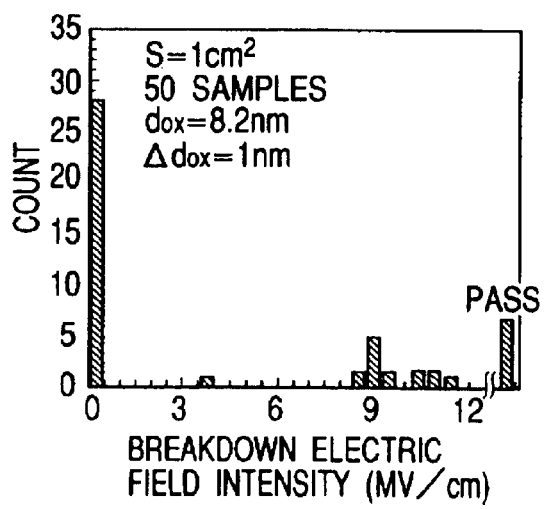
FIGS. 11(a) and 11(b) are graphs showing the measured results of breakdown voltage of the silicon oxide film constituting the gate-insulating film on the thick-film portion of when the process for forming two kinds of gate-insulating films studied by the present inventors is adapted to the salicide process.
Figure 11B:
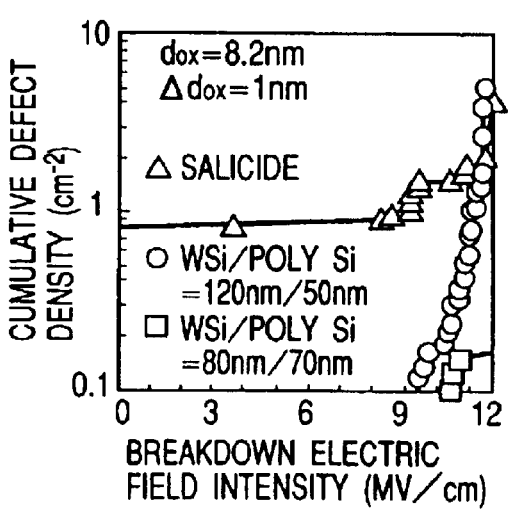

FIGS. 10 and 11 illustrate the measured results of breakdown voltage of the silicon oxide film 9a of when the technical idea of the invention is applied to the so-called salicide process for forming silicide layers on the gate electrode of the field-effect transistor and on the semiconductor region for source/drain, and the measured results of breakdown voltage of the silicon oxide film 52 of when the process for forming two kinds of gate-insulating films discussed by the inventors is applied to the salicide process. FIGS. 10(a) and 11(a) illustrate only the case where the gate electrode is of the salicide structure, and FIGS. 10(b) and 11(b) illustrate both the case where the gate electrode is of the salicide structure (triangles represent measuring points) and the case where the gate electrode is of the polycide structure (in which a silicide layer is formed on the polycrystalline silicon film)(circles and squares represent measuring points). In the gate electrode of the polycide structure, the silicide layer is, for example tungsten silicide.

It will be understood from FIG. 11 that the silicon oxide film 52 on the thick-film portion loses the breakdown voltage when the process for forming two kinds of gate-insulating films discussed by the inventors is adapted to the salicide process or to the polycide process. According to the technical idea of the invention as shown in FIG. 10, on the other hand, the breakdown voltage of the silicon oxide film 9a on the thick-film portion can be improved even when the invention is applied to the salicide process and to the polycide process. In particular, distinguished effect is exhibited when the invention is applied to the salicide process.

Figure 12:
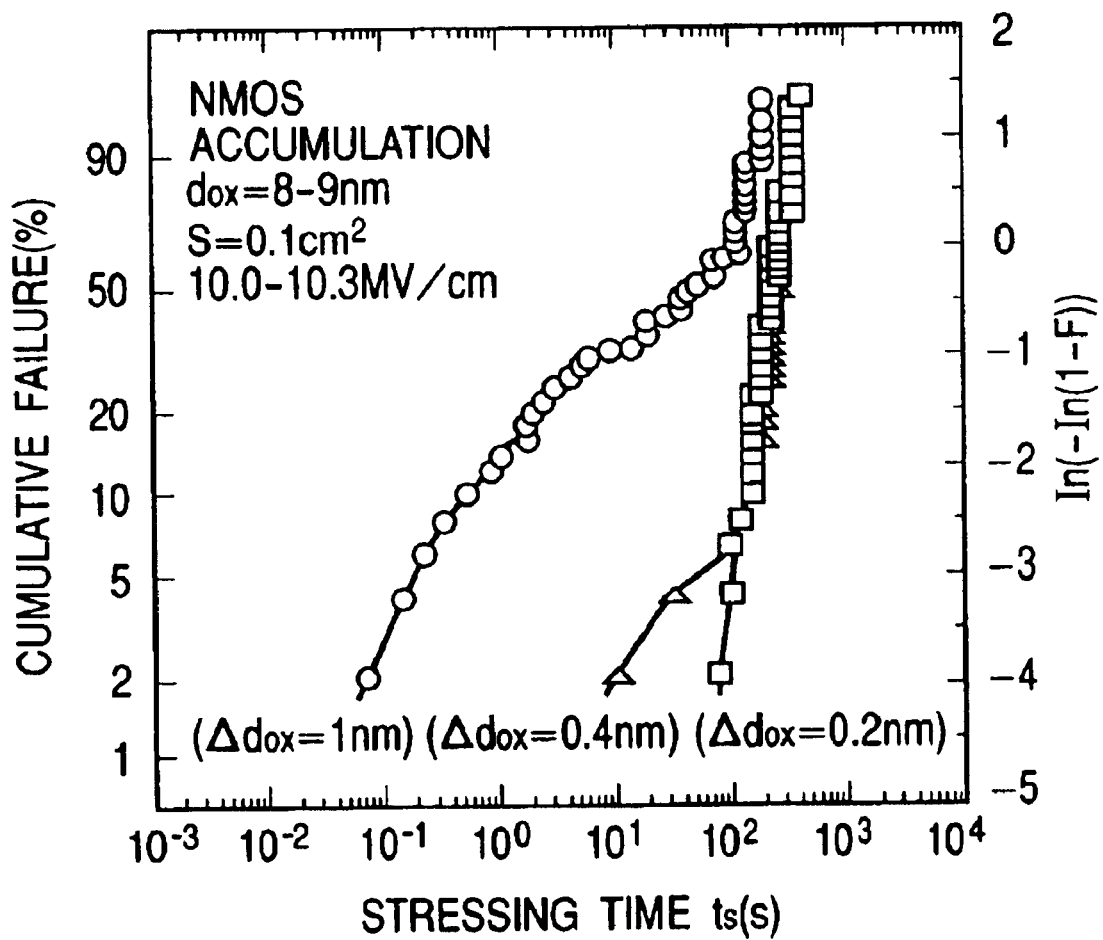
FIG. 12 is a graph showing a relationship between the stressing time (time until failure occurs) and the cumulative failure for every scrape-off of the silicon oxide film on the thick-film portion through the pre-washing.

FIG. 12 illustrates the results of evaluating TDDP (time dependence dielectric breakdown) by measuring the time up to the occurrence of breakage when the stress of a predetermined electric, field intensity is maintained applied to the gate-insulating film. FIG. 12 illustrates a relationship between the cumulative failure and the stressing time (time until failure occurs) for every scraping amount Δdox of the silicon oxide film 6 on the thick-film portion through the pre-washing. Open circles represent a case when Δdox is about 1 nm, triangles represent a case when Δdox is about 0.4 nm, and squares represent a case when Δdox is about 0.2 nm. It will be understood from FIG. 12 that the stressing time becomes long, i.e., the life becomes long with a decrease in the scraping amount Δdox.

Figure 13:
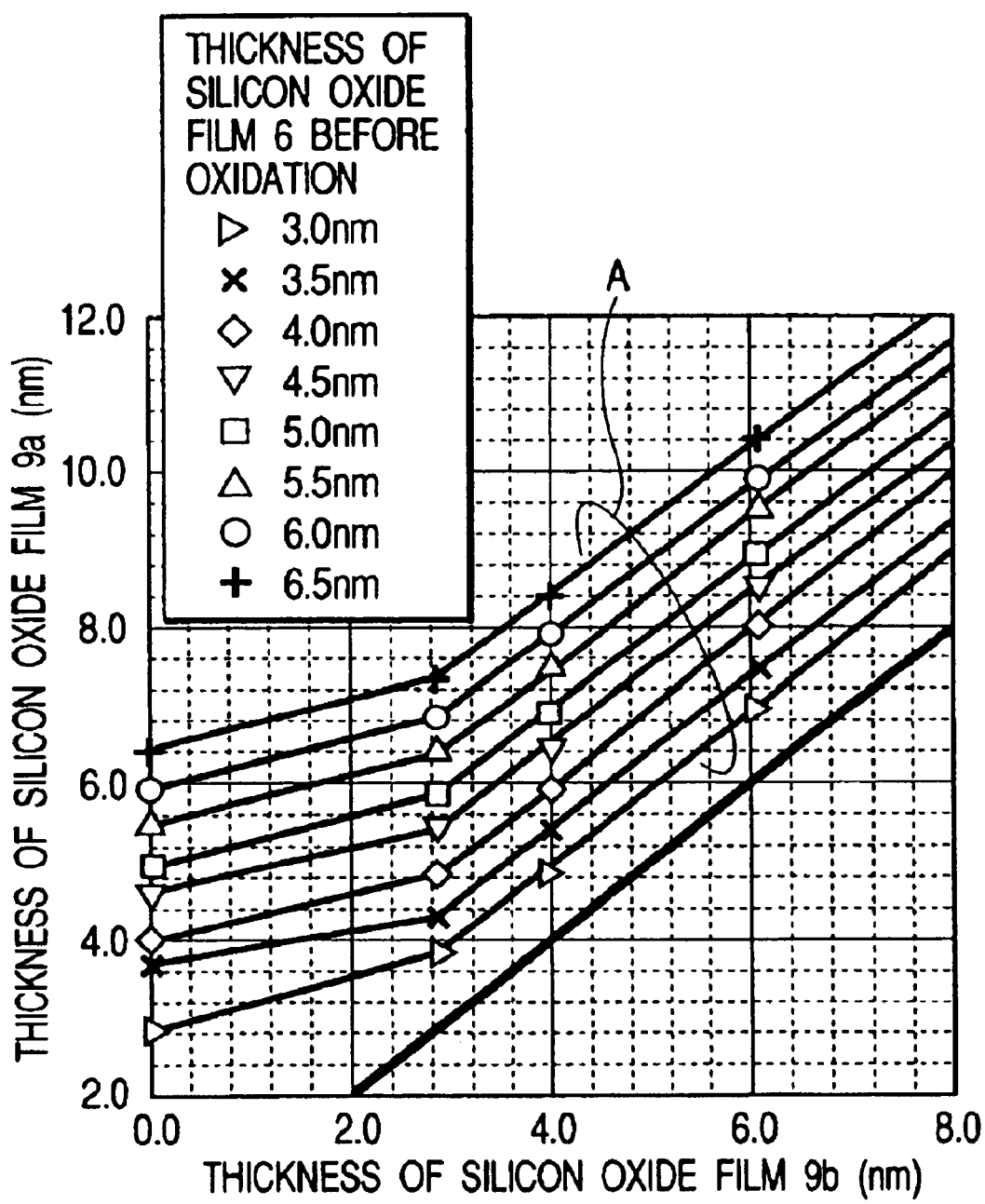
FIG. 13 is a graph illustrating the dependance of the final film thickness on the thickness of the remaining silicon oxide film of when the semiconductor substrate is oxidized in a state where the silicon oxide film is still remaining on the thick-film portion after the pre-washing.

FIG. 13 shows the dependence of the final film thickness (silicon oxide film 9a) on the thickness of the remaining silicon oxide film 6 of when the semiconductor substrate is oxidized in a state where the silicon oxide film 6 is still remaining on the thick-film portion. It will be understood from FIG. 13 that when the semiconductor substrate is oxidized in a state where the silicon oxide film 6 is remaining A, the silicon oxide film 9a on the thick-film portion becomes necessarily larger than the silicon oxide film 9b on the thin-film portion on the semiconductor substrate. That is, the region where the silicon oxide film 6 is formed first becomes the thick-film portion.

Next, the method of manufacturing the CMOS according to an embodiment of the invention will be described with reference to FIGS. 14 to 26. In the drawings, Qn denotes an n-channel MISFET, Qp denotes a p-channel MISFET, a region A is the one where a thick gate-insulating film will be formed, and a region B is the one where a thin gate-insulating film will be formed.

Figure 14:
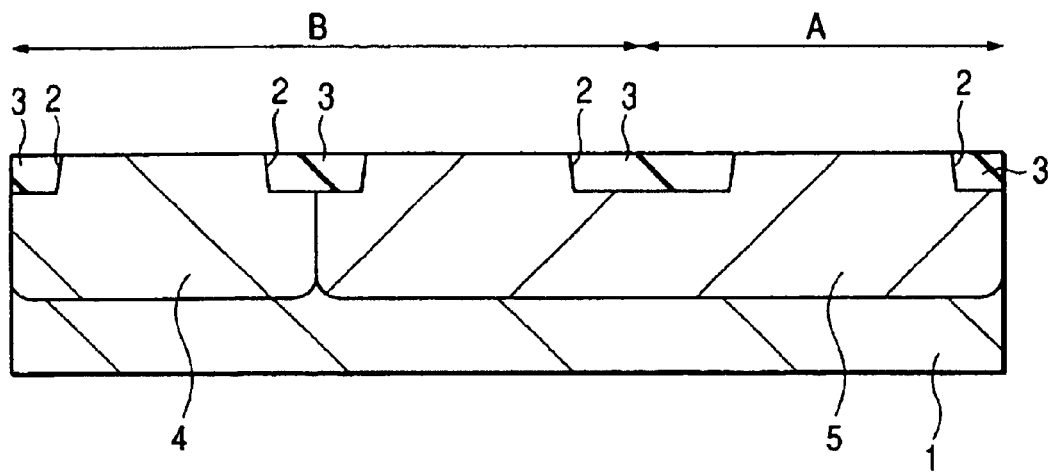
FIG. 14 is a sectional view of a major portion of the semiconductor substrate illustrating a method of manufacturing a CMOS device according to an embodiment of the invention.

Referring, first, to FIG. 14, a semiconductor substrate 1 constituted by a single silicon crystal having a resistivity of about 10 Ω cm is prepared, and a shallow groove 2 is formed in the main surface of the semiconductor substrate 1. The depth of the shallow groove 2 is, for example, about 0.35 μm. Then, the semiconductor substrate 1 is heat-oxidized to form a silicon oxide film (not shown). Then, a silicon oxide film 3 is deposited and is polished by a chemical/mechanical polishing (CMP) method so that the silicon oxide film 3 is left in the shallow groove 2 only thereby to form an element isolation region (trench isolation).

In effecting the polishing by the CMP method, various contrivances are necessary for preventing the active region from being polished and for preventing the surface of the silicon oxide film 3 from becoming lower than the surface of the active region, which, however, are not described here.

Next, p-type impurities such as B (boron) ions are injected into the region where the n-channel MISFET is to be formed thereby to form a p-type well 4, and n-type impurities such as P (phosphorus) ions are injected into the region where the p-channel MISFET is to be formed thereby to form an n-type well 5.

Figure 15:
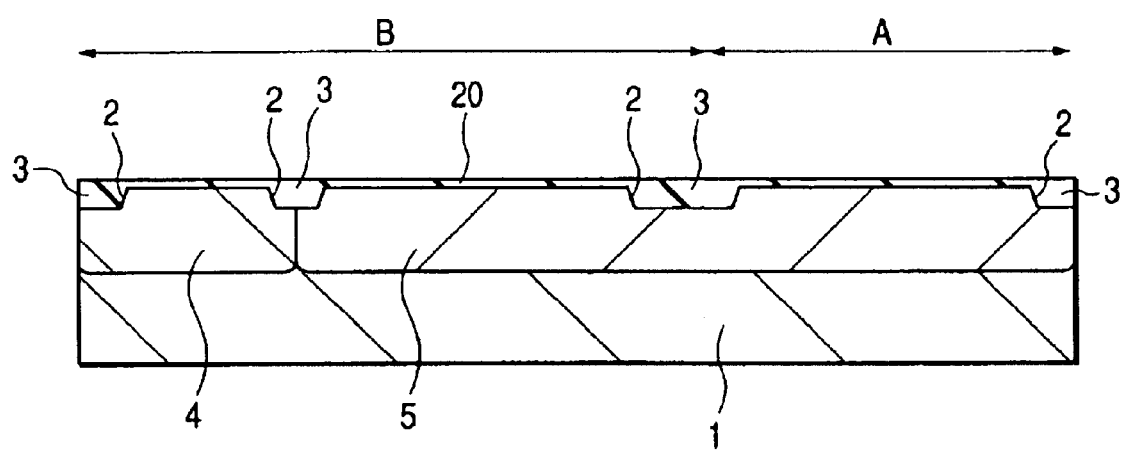
FIG. 15 is a sectional view of a major portion of the semiconductor substrate illustrating the method of manufacturing the CMOS device according to the embodiment of the invention.

Referring next to FIG. 15, the semiconductor substrate 1 is heat-oxidized to form a sacrifice oxide film 20 composed of, for example, a silicon oxide film on the main surface of the semiconductor substrate 1, and the threshold voltages of the n-channel MISFET and of the p-channel MISFET are adjusted in a manner as described below.

Figure 16:
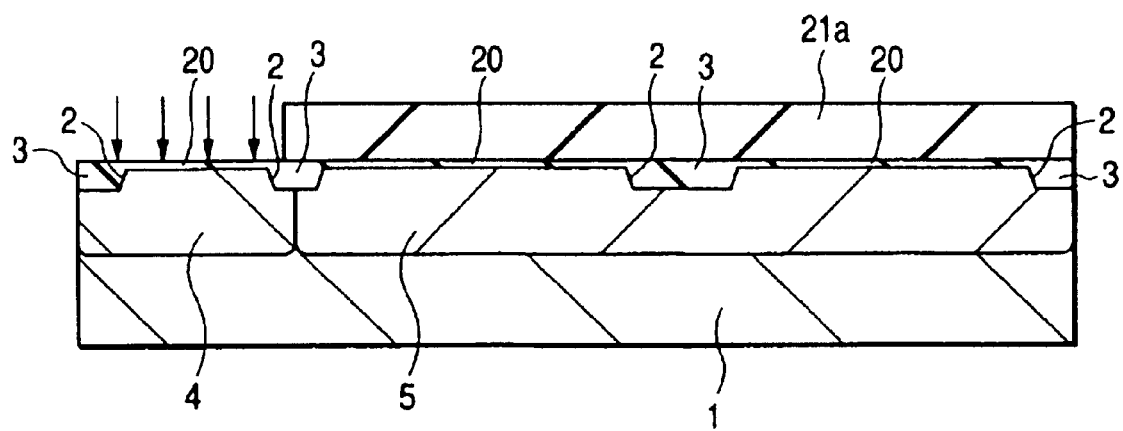
FIG. 16 is a sectional view of a major portion of the semiconductor substrate illustrating the method of manufacturing the CMOS device according to the embodiment of the invention.
Figure 17:
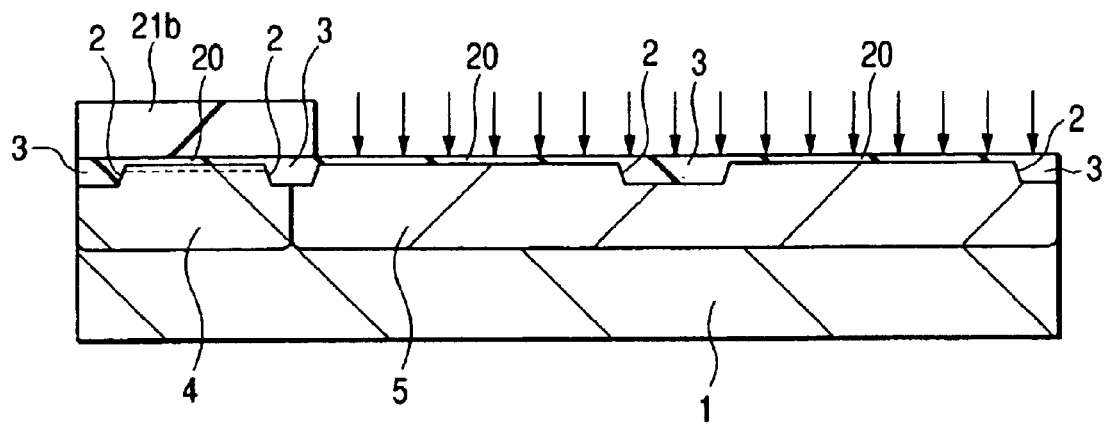
FIG. 17 is a sectional view of a major portion of the semiconductor substrate illustrating the method of manufacturing the CMOS device according to the embodiment of the invention.
Figure 18:
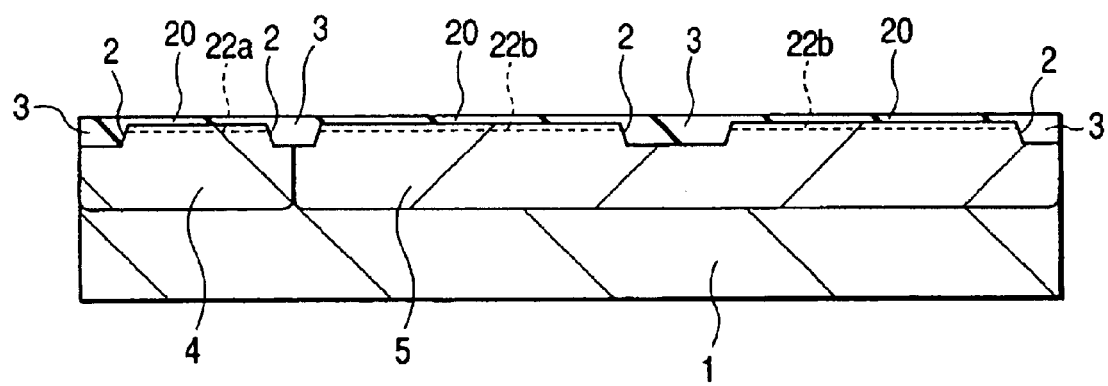
FIG. 18 is a sectional view of a major portion of the semiconductor substrate illustrating the method of manufacturing the CMOS device according to the embodiment of the invention.

First, as shown in FIG. 16, a photoresist pattern 21a is formed on the main surface of the semiconductor substrate 1 exposing the region where the n-channel MISFET is to be formed but covering other regions. By using the photoresist pattern 21a as a mask, $BF_2$ (boron fluoride) is injected into the channel region of the P-type well 4. Then, the photoresist pattern 21a is removed and, as shown in FIG. 17, a photoresist pattern 21b is formed on the main surface of the semiconductor substrate 1 exposing the region where the p-channel MISFET will be formed but covering other regions. By using the photoresist pattern 21b as a mask, P (phosphorus) is injected into the channel region of the n-type well 5. Then, the photoresist pattern 21b is removed, and the semiconductor substrate 1 is heat-treated to form threshold voltage-control layers 22a and 22b on the semiconductor substrate 1 as shown in FIG. 18. The threshold voltage-control layers have a thickness of, for example, about 20 nm.

Figure 19:
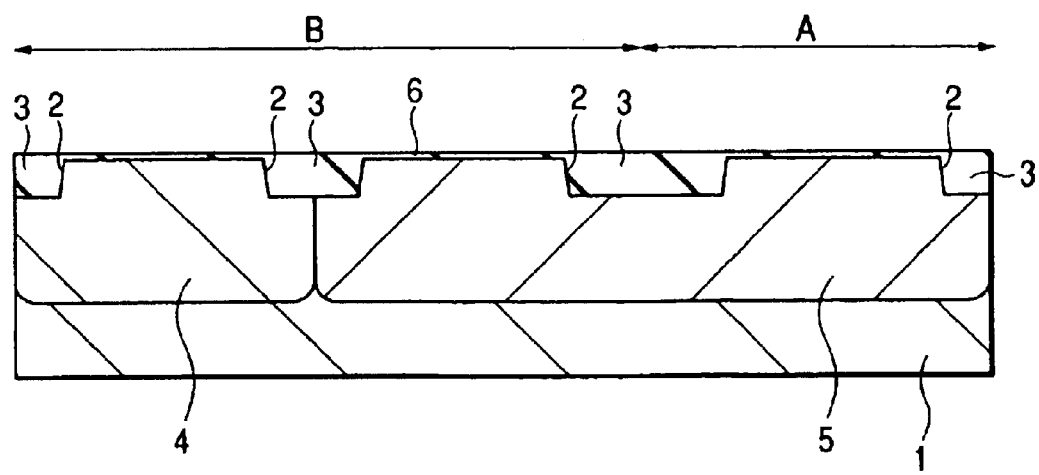
FIG. 19 is a sectional view of a major portion of the semiconductor substrate illustrating the method of manufacturing the CMOS device according to the embodiment of the invention.

Referring next to FIG. 19, the surface of the semiconductor substrate 1 is washed with an aqueous solution containing HF (hydrofluoric acid) and, then, the semiconductor substrate 1 is heat-oxidized to form a silicon oxide film 6 maintaining a thickness of about 7 to 8 nm on the surface of the semiconductor substrate 1.

Figure 20:
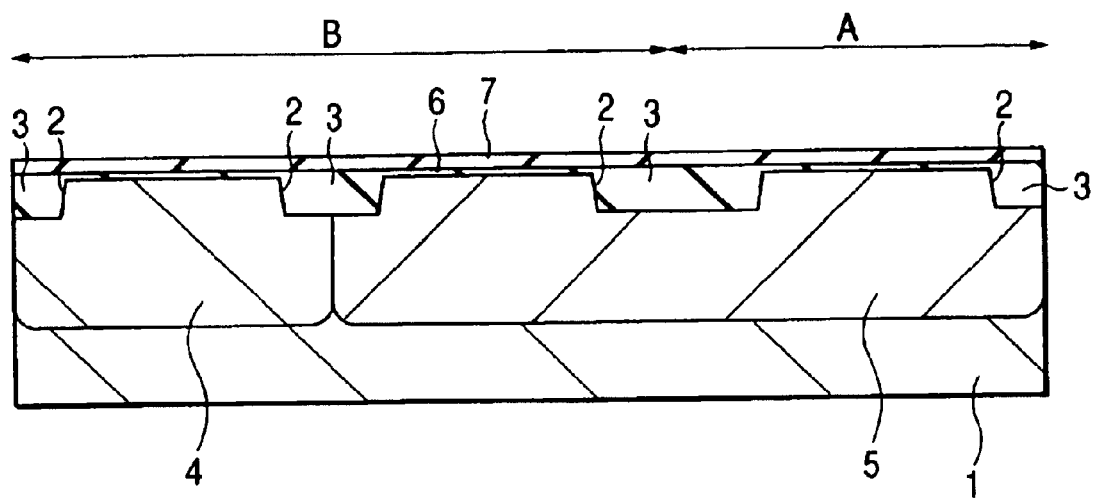
FIG. 20 is a sectional view of a major portion of the semiconductor substrate illustrating the method of manufacturing the CMOS device according to the embodiment of the invention.

Referring next to FIG. 20, a silicon oxide film 7 is deposited maintaining a thickness of about 5 to 15 nm on the silicon oxide film 6 which is a protection film by a chemical vapor deposition (CVD) method of a low pressure at a temperature of about 630° C. The silicon oxide film 7 is formed by the thermal decomposition reaction of an organic source (e.g., $si(OC_2H_5)_4$). Prior to depositing the silicon oxide film 7, the surface of the silicon oxide film 6 may be washed with an aqueous solution containing hydrofluoric acid to remove the silicon oxide film 6 by about 1 nm. The silicon oxide film 7 may be formed by the CVD method using an inorganic source (e.g., $SiH_4$, $SiH_2Cl_2$).

Figure 21:
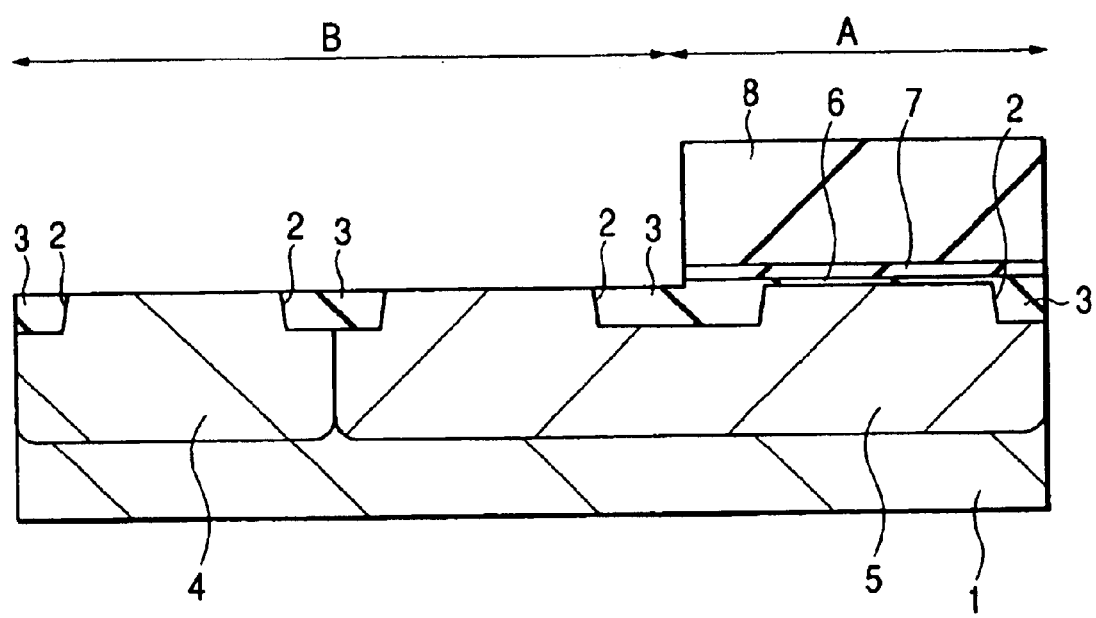
FIG. 21 is a sectional view of a major portion of the semiconductor substrate illustrating the method of manufacturing the CMOS device according to the embodiment of the invention.

Referring next to FIG. 21, the silicon oxide film 7 and the silicon oxide film 6 are successively removed from the region B on where the thin gate-insulating film is to be formed by using the photoresist pattern 8 as a mask. The photoresist pattern 8 is formed by an ordinary photolithography technology. That is, the photoresist pattern 8 is formed by applying a photoresist film and, then, subjecting the photoresist film to the exposure to light or to the developing.

Figure 22:
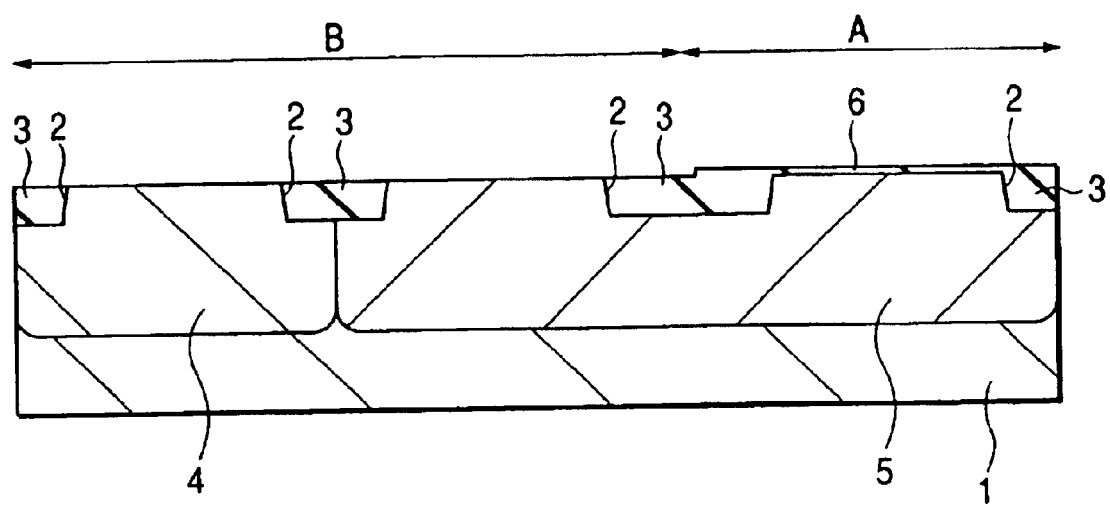
FIG. 22 is a sectional view of a major portion of the semiconductor substrate illustrating the method of manufacturing the CMOS device according to the embodiment of the invention.

Referring next to FIG. 22, the photoresist pattern 8 is removed and, then, the washing is effected for about 5 minutes by using an aqueous solution of, for example, $NH_3:H_2O_2:H_2O=2:5:100$ maintained at 70° C. Thereafter, the silicon oxide film 7 is chiefly removed with a dilute solution of hydrofluoric acid. Here, the silicon oxide film 7 formed by the CVD method is etched at a rate about 15 times as greater as the rate of etching the silicon oxide film 6 formed by the heat oxidation. Thus, the silicon oxide film 7 is selectively removed. The silicon oxide film 6 may be removed to such an extent that no defect is introduced into the film.

Figure 23:
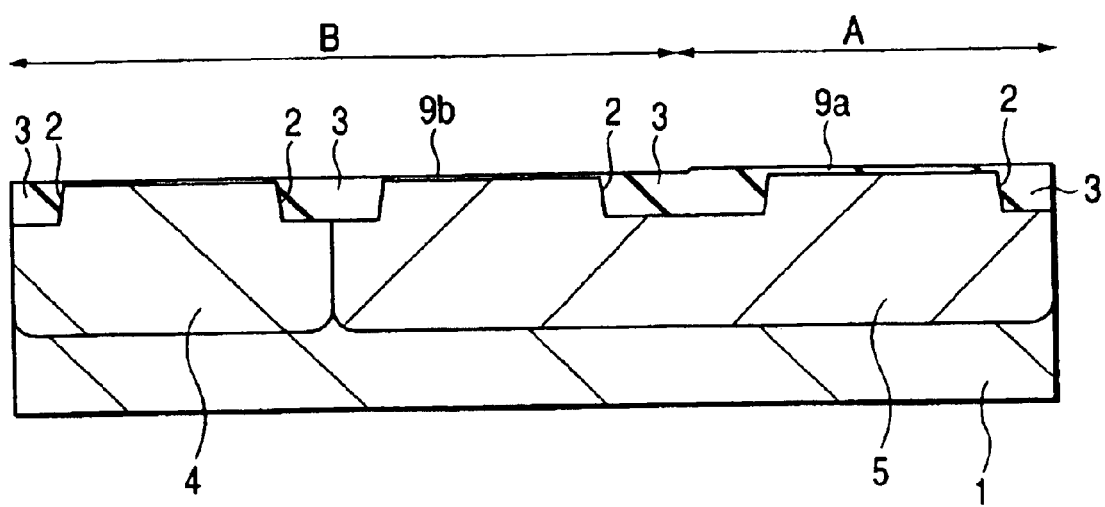
FIG. 23 is a sectional view of a major portion of the semiconductor substrate illustrating the method of manufacturing the CMOS device according to the embodiment of the invention.

Referring next to FIG. 23, the semiconductor substrate 1 is heat-oxidized to form a silicon oxide film 9a having a thickness of about 8 nm to constitute a thick gate-insulating film on the region A where the silicon oxide film 6 has been formed and to form a silicon oxide film 9b having a thickness of about 3 to 4 nm to constitute a thin gate-insulating film on the region B where the surface of the semiconductor substrate 1 is being exposed. Here, after the heat oxidation, the oxidizing/nitriding treatment may be effected in an NO or $N_2O$ atmosphere to introduce nitrogen into the silicon oxide films 9a and 9b. This improves resistance against the hot carrier effect.

Figure 24:
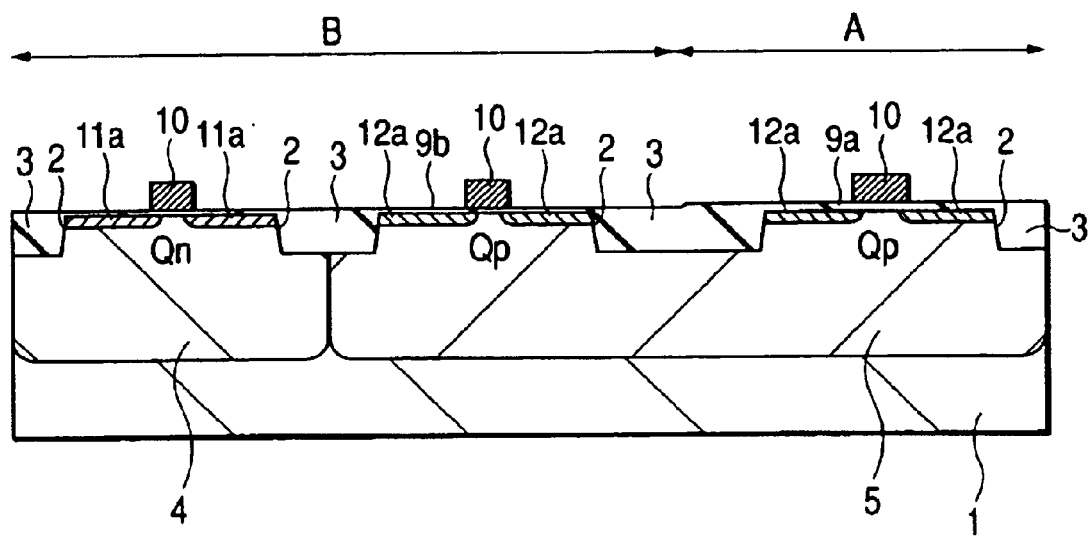
FIG. 24 is a sectional view of a major portion of the semiconductor substrate illustrating the method of manufacturing the CMOS device according to the embodiment of the invention.

Referring next to FIG. 24, a polycrystalline silicon film doped with n-type impurities such as P is deposited on the semiconductor substrate 1 by the CVD method, and the polycrystalline silicon film is etched with the photoresist pattern as a mask thereby to form a gate electrode 10 constituted by the polycrystalline silicon film.

Then, with the gate electrode 10 as a mask, n-type impurities (e.g., P) are introduced into the p-type well 4 to form an $n^-$-type semiconductor region 11a of a low concentration to constitute portions of source and drain of the n-channel MISFET Qn. Similarly, with the gate 10 as a mask, p-type impurities (e.g., $BF_2$) are introduced into the n-type well 5 to form a $p^-$-type semiconductor region 12a of a low concentration to constitute portions of source and drain of the p-channel MISFET Qp.

Figure 25:
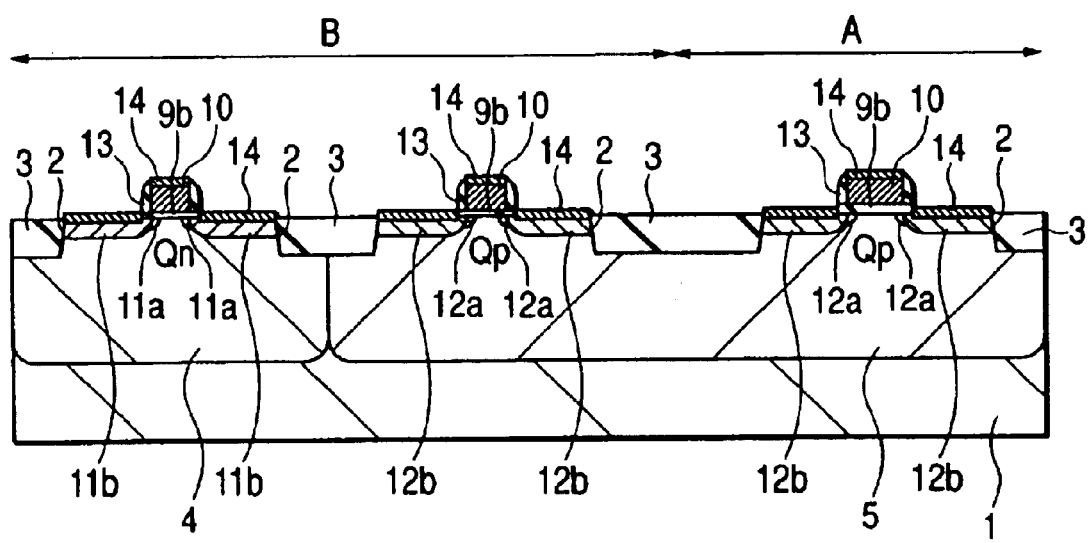
FIG. 25 is a sectional view of a major portion of the semiconductor substrate illustrating the method of manufacturing the CMOS device according to the embodiment of the invention.

Referring next to FIG. 25, the silicon oxide film deposited on the semiconductor substrate 1 by the CVD method is etched by the RIE (reactive ion etching) method in order to form a side wall spacer 13 on the side wall of the gate electrode 10.

Next, with the gate electrode 10 and the side wall spacer 13 as masks, n-type impurities (e.g., As (arsenic)) are introduced into the p-type well 4 to form an $n^+$-type semiconductor region 11b of a high concentration to constitute other portions of source and drain of the n-channel MISFET Qn. Similarly, with the gate electrode 10 and the side wall spacer 13 as masks, p-type impurities (e.g., $BF_2$) are introduced into the n-type well 5 to form a $p^+$-type semiconductor region 12b of a high concentration to constitute other portions of source and drain of the p-channel MISFET Qp.

Next, a titanium silicide film 14 of a low resistance is formed on the surface of the gate electrode 10 of the n-channel MISFET Qn, on the surface of the $n^{30}$-type semiconductor region 11b, on the surface of the gate electrode 10 of the p-channel MISFET Qp and on the surface of the $p^+$-type semiconductor region 12b by the self-aligning method. That is, a metal film such as of titanium is deposited by the sputtering method or the CVD method on the main surface of the semiconductor substrate 1 in a state where the upper surfaces of the $n^+$-type semiconductor region 11b, $p^+$-type semiconductor region 12b and gate electrode 10 are exposed and, then, the semiconductor substrate 1 is heat-oxidized, in order to form the titanium silicide film 14 on a contact portion between the metal film and the $n^+$-type semiconductor region 11b, and on a contact portion between the $p^+$-type semiconductor region 12b and the gate electrode 10. Here, however, the silicide film that is formed is in no way limited to the titanium silicide film only but may be changed in various ways, and may be, for example, a cobalt silicide film.

Figure 26:
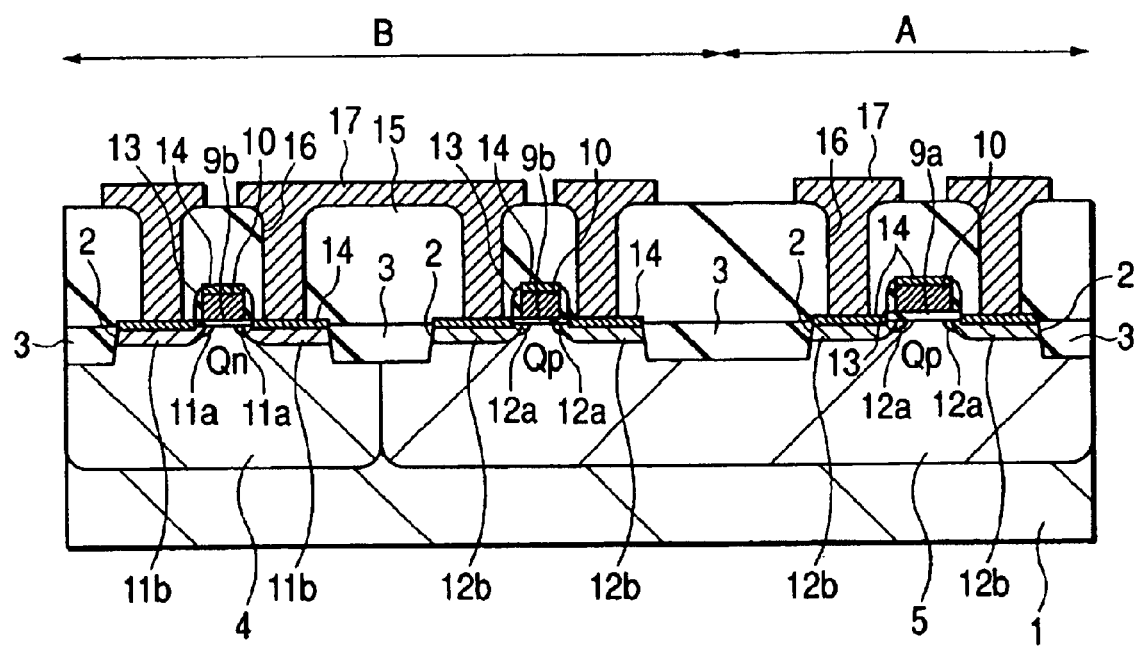
FIG. 26 is a sectional view of a major portion of the semiconductor substrate illustrating the method of manufacturing the CMOS device according to the embodiment of the invention.

Referring next to FIG. 26, an interlayer insulating film 15 is formed on the semiconductor substrate 1, a contact hole 16 is perforated by etching the interlayer insulating film 15, and a wiring layer 17 is formed by etching a metal film (not shown) deposited on the interlayer insulating film 15 thereby to complete the CMOS device.

The thickness of the silicon oxide film 7 and the amount of etching the silicon oxide film 7 play important roles. As required, therefore, the thickness of the film may be managed relying upon a monitor dummy in forming the silicon oxide film 7, and the etching amount may be regularly managed relying upon the above monitor dummy.

Figure 27:
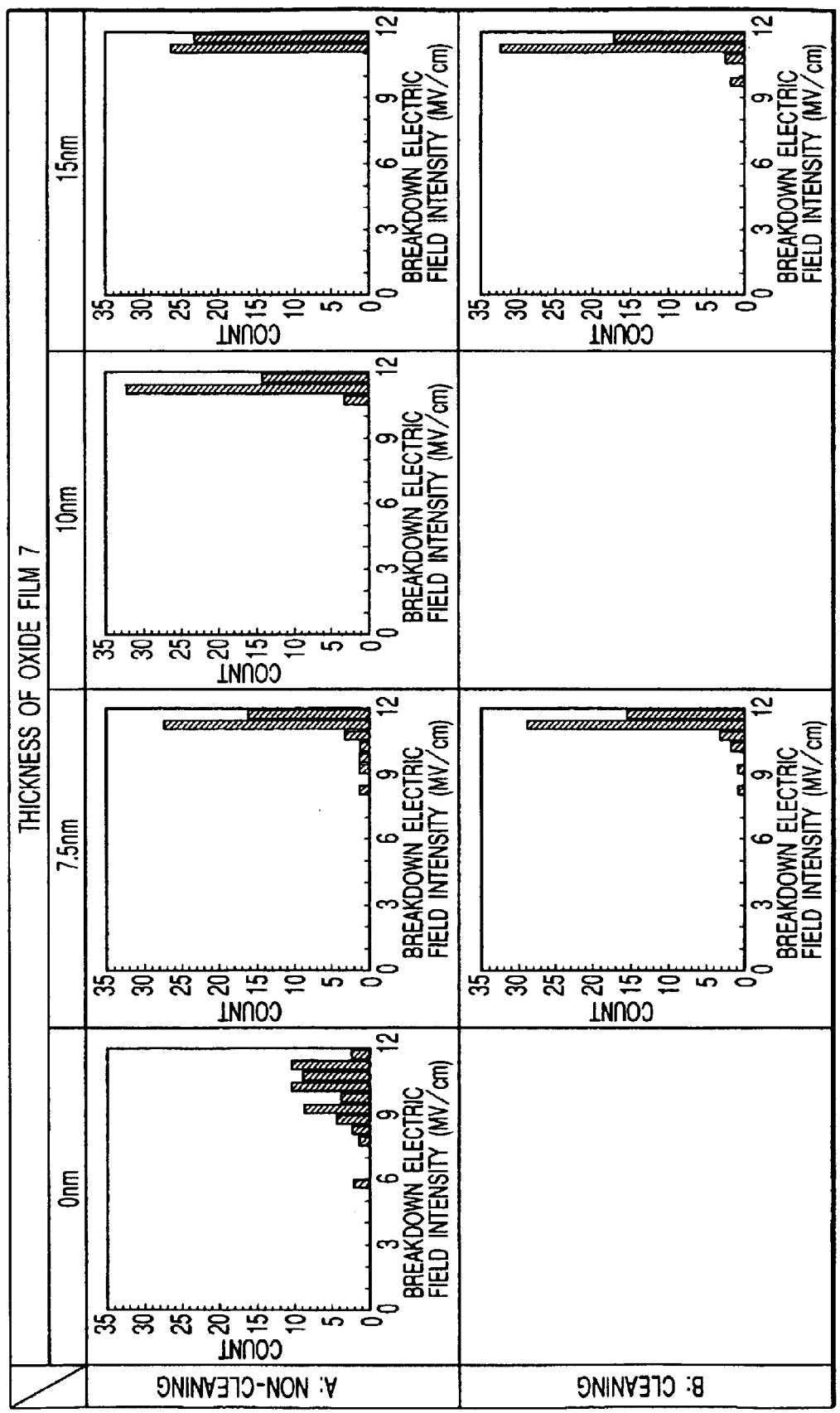
FIG. 27 is a graph illustrating the evaluated results of breakdown voltage of the silicon oxide film constituting a thick gate-insulating film to which the embodiment 1 is applied.

FIG. 27 is a graph illustrating the measured results of breakdown voltage of the silicon oxide film 9a. A capacitor is prepared by using a special photo mask so as to have an area of the silicon oxide film 9a of 100 $mm^2$ by successively forming a polycrystalline silicon film and a tungsten silicide (WSi) film on the silicon oxide film 9a formed by the production steps shown in FIGS. 14 to 23. Here, however, for evaluating only the region for forming the n-channel MISFET, the p-type well 4 only is formed but the n-type well 5 is not formed. In the upper stage A of FIG. 27 are shown the breakdown voltages of the laminated films having the silicon oxide films 7 of thicknesses of 7.5 nm, 10 nm and 15 nm on the silicon oxide film 6, and in the lower stage B are shown the breakdown voltages of when the silicon oxide film 6 is washed prior to forming the silicon oxide film 7. Through the washing, the silicon oxide film 6 is removed by about 1 nm.

Referring to FIG. 27, the silicon oxide film 7 is laminated to prepare a favorable silicon oxide film 9a having markedly improved breakdown voltage. Further, a comparable breakdown voltage is obtained even by washing the silicon oxide film 6 prior to forming the silicon oxide film 7. It will be understood that the washing may be effected after the silicon oxide film 6 is formed or prior to forming the silicon oxide film 7.

Figure 28:
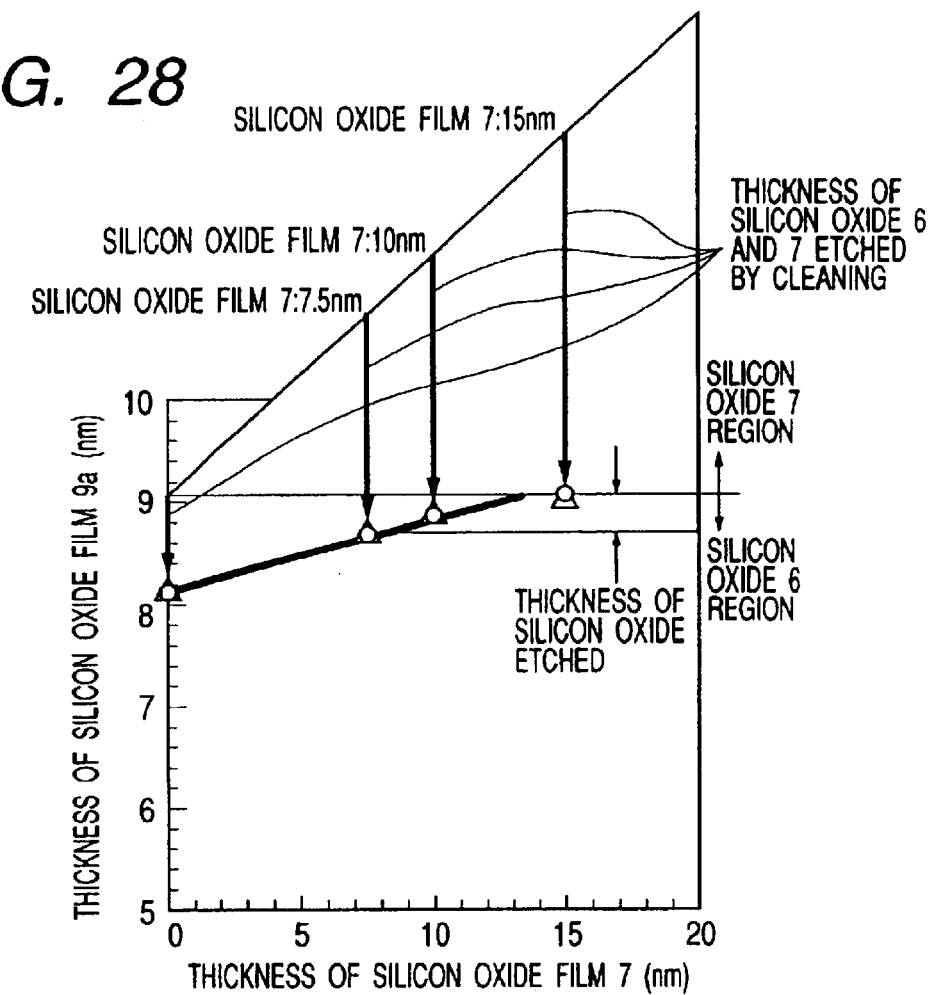
FIG. 28 is a graph illustrating a relationship between the thickness of the silicon oxide film constituting the thick gate-insulating film and the thickness of the silicon oxide film formed by the CVD method, the silicon oxide film formed by the CVD method contacting to the photoresist film, according to the embodiment 1.

FIG. 28 illustrates a relationship between the thickness of the silicon oxide film 7 and the thickness of the silicon oxide film 9a. Here, the etching is effected after the removal of the photoresist pattern 8 to such an extent that would remove the thickness by about 1 nm if it is applied to the silicon oxide film 6.

After the silicon oxide film 6 is formed maintaining a thickness of 7 nm, if the semiconductor substrate is heat-oxidized without being washed so as to form a silicon oxide film maintaining a thickness of 4 nm thereon, then, the thickness of the silicon oxide film 9a becomes 9.1 nm. Therefore, the difference between this value and the thickness of the silicon oxide film 9a of when the silicon oxide film 7 is not laminated, represents the amount by which the silicon oxide film 6 is removed by etching. When the silicon oxide film 7 is not formed, the silicon oxide film 9a has a thickness of 8.1 nm, and a difference of 1 nm from the above value of 9.1 nm represents the amount of the silicon oxide film 6 scraped off by washing. Similarly, the scraping amount is 0.4 nm when the thickness of the silicon oxide film 7 is 7.5 nm thick, the scraping amount is 0.2 nm when the silicon oxide film 7 is 10 nm thick, and the scraping amount is 0 nm when the silicon oxide film 7 is 15 nm thick.

As shown in FIG. 27, a favorable breakdown voltage is obtained when the silicon oxide film 7 having a thickness of from 7.5 to 10 nm is laminated, from which it will be understood that defect does not almost occur when the scraping amount Δdox of the silicon oxide film 6 is from 0.2 to 0.4 nm. Thus, favorable silicon oxide films 9a and 9b are obtained without decreasing the washing amount after the photoresist pattern 8 has been removed.

Figure 29:
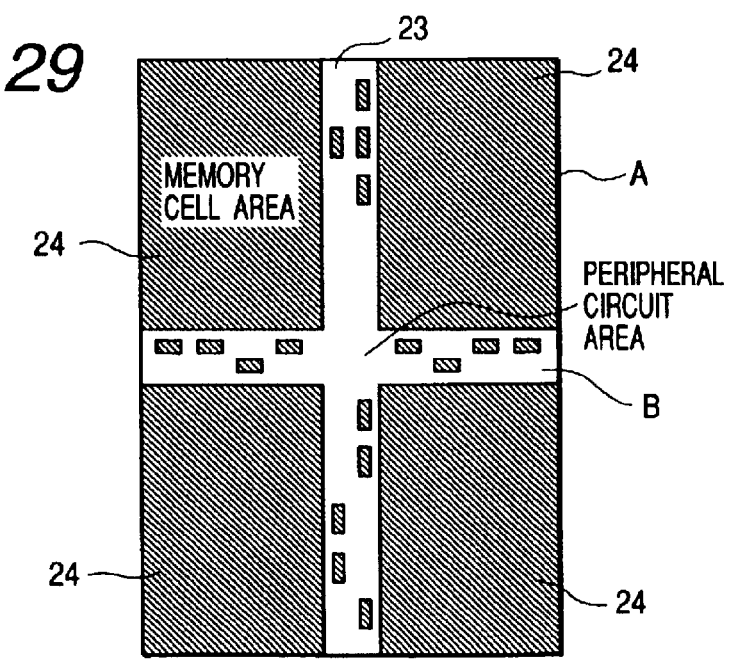
FIG. 29 is a plan view of a semiconductor chip constituting another semiconductor integrated circuit device according to the embodiment 1.

FIG. 29 is a plan view of a semiconductor chip 1C in which a DRAM (dynamic random access memory) is formed based on the technical idea of the invention. On the main surface of the semiconductor chip 1C is arranged a peripheral circuit area 23 of a crossed shape on a plane so as to equally divide the main surface into four. The four regions divided by the peripheral circuit area 23 are memory cell areas 24. In this semiconductor chip 1C, the hatched areas represent thick-film portions on where field-effect transistors are formed having a relatively thick gate-insulating film. The region A of the thick-film portion occupies a portion of the peripheral circuit area 23 and the memory cell area 24. On the other hand, the region B of the thin-film portion on which field-effect transistors are formed having a relatively thin gate-insulting film occupies the peripheral circuit area 23 only. In terms of the area, the region A of the thick-film portion is about 30 times wider than the region B of the thin-film portion.

According to this embodiment as described above, the photoresist pattern 8 is not formed directly on the silicon oxide film 6 but is formed thereon via the silicon oxide film 7 which is the protection film formed by the CVD method at the time of forming two kinds of gate-insulating films of different thicknesses. Therefore, contaminants from the photoresist film adheres on the silicon oxide film 7 that is formed by the CVD method. Thereafter, the silicon oxide film 7 is selectively removed preventing the silicon oxide film 6 from being contaminated by the photoresist film, avoiding the effect of fixed electric charge in the silicon oxide film 7 and further avoiding damage in the step of removing the resist and in the subsequent step of washing. By introducing nitrogen into the silicon oxide films 9a and 9b, further, the resistance can be increased against the hot carrier effect.

Embodiment 2

The method of forming the gate-insulating film of the MISFET according to another embodiment of the invention will be described with reference to FIGS. 30 to 33.

First, a threshold voltage control layer is formed in the same manner as the one described in the embodiment 1 with reference to FIGS. 16 to 18.

Figure 30:
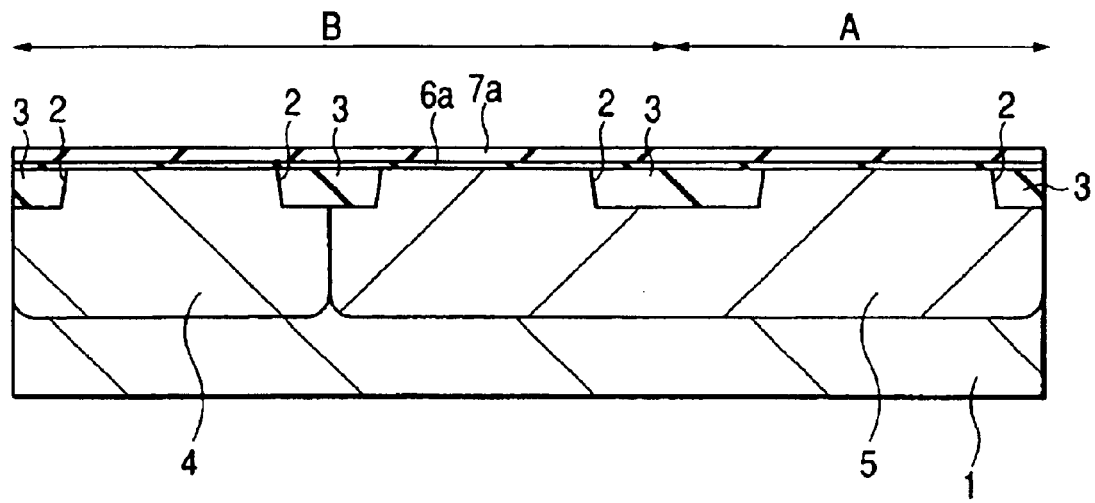
FIG. 30 is a sectional view of a major portion of a semiconductor substrate illustrating the method of forming a gate-insulating film of an MISFET according to another embodiment of the invention.

Referring next to FIG. 30, the surface of the semiconductor substrate 1 is washed with an aqueous solution of hydrofluoric acid and, then, a silicon oxide film 6a is deposited by the CVD method. In forming the silicon oxide film 6a, another silicon oxide film may be deposited maintaining a thickness of about 1 nm as an underlying film to prevent the infiltration of contaminant into the semiconductor substrate 1 or to maintain favorable interface properties between the silicon oxide film 6a and the semiconductor substrate 1. As a method of depositing the underlying film, piece-by-piece oxidation may be effected at a low temperature of about 700° C. for short periods of time prior to depositing the silicon oxide film 6a, or the sequence for forming the silicon oxide film 6a may be so changed as to start depositing the silicon oxide film 6a after being left to stand in a high-temperature oxidizing atmosphere. Thereafter, a silicon oxide film 7a is formed by the CVD method on the silicon oxide film 6a, the silicon oxide film 7a serving as a protection film and having a composition different from the silicon oxide film 6a.

Figure 31:
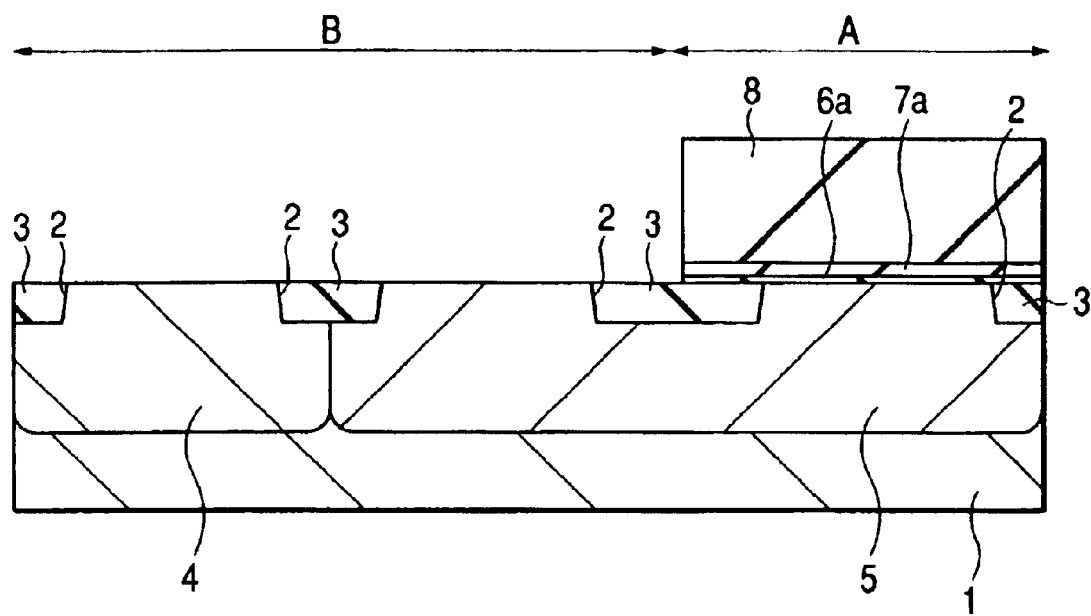
FIG. 31 is a sectional view of the major portion of the semiconductor substrate illustrating the method of forming the gate-insulating film of the MISFET according to another embodiment of the invention.

Referring next to FIG. 31, the silicon oxide film 7a and the silicon oxide film 6a are successively removed from the region B on where a thin gate-insulating film is to be formed by using the photoresist pattern 8 as a mask.

Figure 32:
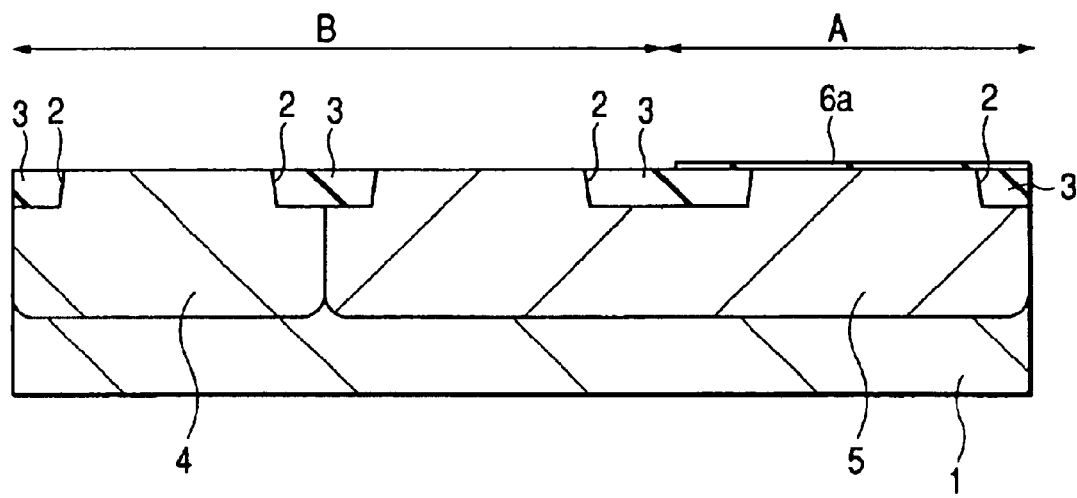
FIG. 32 is a sectional view of the major portion of the semiconductor substrate illustrating the method of forming the gate-insulating film of the MISFET according to another embodiment of the invention.
Figure 33:
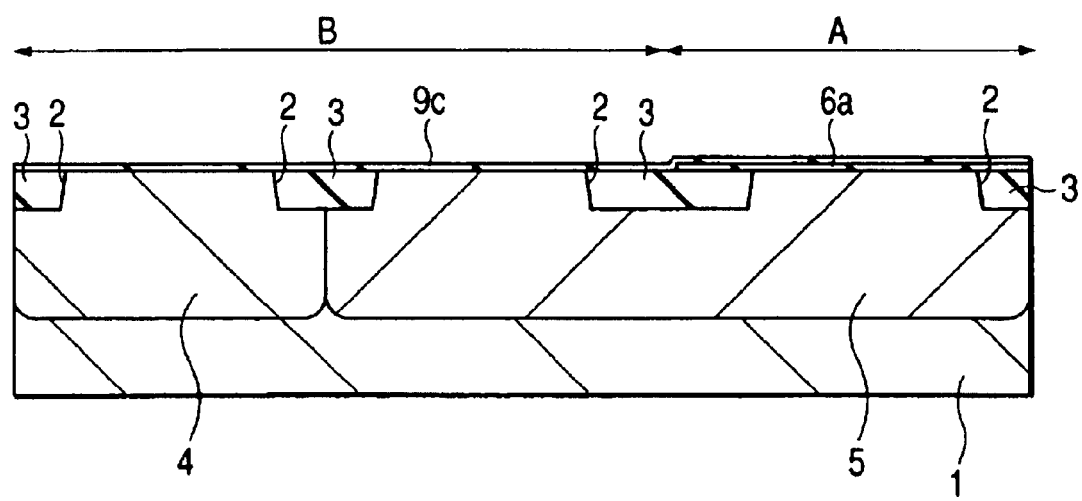
FIG. 33 is a sectional view of the major portion of the semiconductor substrate illustrating the method of forming the gate-insulating film of the MISFET according to another embodiment of the invention.

Referring next to FIG. 32, the photoresist pattern 8 is removed and, then, the silicon oxide film 7a is chiefly removed. Referring next to FIG. 33, a silicon oxide film 9c is deposited on the semiconductor substrate 1 by the CVD method. Prior to depositing the silicon oxide film 9c, a silicon oxide film may be deposited maintaining a thickness of about 1 nm as an underlying film on the exposed surface of the semiconductor substrate 1. Thus, a laminate of the silicon oxide film 6a and the silicon oxide film 9c is formed on the region A where the thick gate-insulating film is to be formed, and the silicon oxide film 9c only is formed on the region B where the thin gate-insulting film is to be formed.

Embodiment 3

The method of forming the gate-insulating film of the MISFET according to a further embodiment of the invention will be described.

In this embodiment 3, first, the silicon oxide film 6 is provided on the region A where the thick gate-insulating film is to be formed as shown in FIG. 22 by the method described in the embodiment 1 exposing the surface of the region B of the semiconductor substrate 1 on where the thin gate-insulating film is to be formed.

Thereafter, an insulating film other than the silicon oxide film, such as a film of silicon nitride (SiN), a film of tantalum oxide ($Ta_2O_5$) or a film of titanium oxide ($TiO_2$) is formed on the semiconductor substrate 1. These films can be deposited by the CVD method, plasma CVD method or JVD (jet vapor deposition) method. Prior to depositing the insulating film, a silicon oxide film may be deposited maintaining a thickness of about 1 nm as an underlying film on the exposed surface of the semiconductor substrate 1. Thus, a laminate of the silicon oxide film 6 and the insulating film is formed on the region A where the thick gate-insulating film is to be formed and the above insulating film only is formed on the region B where the thin gate-insulating film is to be formed.

That is, part of the gate-insulating film on the region A which is the thick-film portion and the whole gate-insulating film on the region B which is the thin-film portion are formed of a material having a dielectric constant larger than that of the silicon oxide film in order to increase the thickness of the gate-insulating films compared to when the gate-insulating films are formed of the silicon oxide film only yet maintaining comparable characteristics of the MISFET. This makes it easy to form the gate-insulating films. It is further allowed to suppress or prevent the flow of a gate current (tunnel current) between the gate electrode and the semiconductor substrate.

Embodiment 4

Described below is a method of forming the gate-insulating film of the MISFET according to a still further embodiment of the invention.

In this embodiment 4, first, the silicon oxide film 6a is provided on the region A where the thick gate-insulating film is to be formed as shown in FIG. 32 by the method described in the embodiment 2 exposing the surface of the region B of the semiconductor substrate 1 on where the thin gate-insulating film is to be formed.

Thereafter, an insulating film other than the silicon oxide film, such as a film of SiN, a film of $Ta_2O_5$ or a film of $TiO_2$ is formed on the semiconductor substrate 1. These films can be deposited by the CVD method, plasma CVD method or JVD method. Prior to depositing the insulating film, a silicon oxide film may be deposited maintaining a thickness of about 1 nm as an underlying film on the exposed surface of the semiconductor substrate 1. Thus, a laminate of the silicon oxide film 6a and the above insulating film is formed on the region A where the thick gate-insulating film is to be formed and the above insulating film only is formed on the region B where the thin gate-insulating film is to be formed. Therefore, the following effects are obtained like in the above embodiment 3. This makes it easy to form the gate-insulating films. It is further allowed to suppress or prevent the flow of a gate current (tunnel current) between the gate electrode and the semiconductor substrate.

Embodiment 5

Described below is a method of forming the gate-insulating film of the MISFET according to a yet further embodiment of the invention.

In this embodiment 5, first, a laminate of the silicon oxide film 6a and the silicon oxide film 9c is formed on the region A where the thick gate-insulating film is to be formed, and the silicon oxide film 9c only is formed on the region B where the thin gate-insulating film is to be formed as shown in FIG. 33 by the method described in the embodiment 2.

Thereafter, the semiconductor substrate 1 is subjected to the heat-nitriding, plasma-nitriding or radical-nitriding in order to improve properties on the interface between the silicon oxide film 6a and the semiconductor substrate 1 and between the silicon oxide film 9c and the semiconductor substrate 1.

Embodiment 6

Described below is a method of forming the gate-insulating film of the MISFET according to a further embodiment of the invention.

In this embodiment 6, first, the surface of the semiconductor substrate 1 is washed with an aqueous solution of hydrofluoric acid as shown in FIG. 30 by the method described in the embodiment 2, and a silicon oxide film 6a is deposited by the CVD method. In forming the silicon oxide film 6a, another silicon oxide film may be deposited maintaining a thickness of about 1 nm as an underlying film in order to prevent the infiltration of contaminants into the semiconductor substrate 1 or to maintain favorable interfacial properties between the silicon oxide film 6a and the semiconductor substrate 1.

Next, the semiconductor substrate 1 is subjected to the heat-nitriding, plasma-nitriding or radical-nitriding to reform part of the silicon oxide film 6a.

Thereafter, a laminate of the reformed film of the silicon oxide film 6a and the silicon oxide film 9c is formed on the region A where the thick gate-insulating film is to be formed and the silicon oxide film 9c only is formed on the region B where the thin gate-insulating film is to be formed in the same manner as the one described in embodiment 2.

Figure 34:
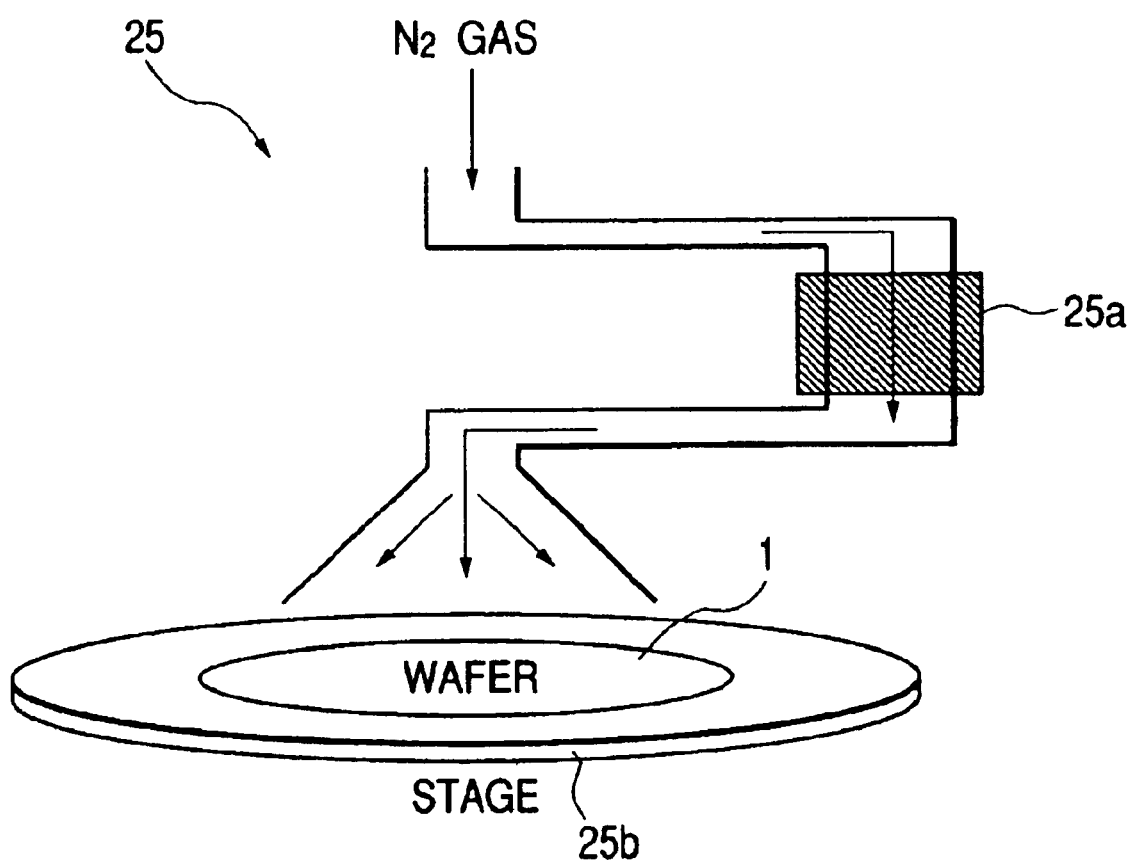
FIG. 34 is a view illustrating a film-forming device used in another embodiment of the invention.
Figure 35:
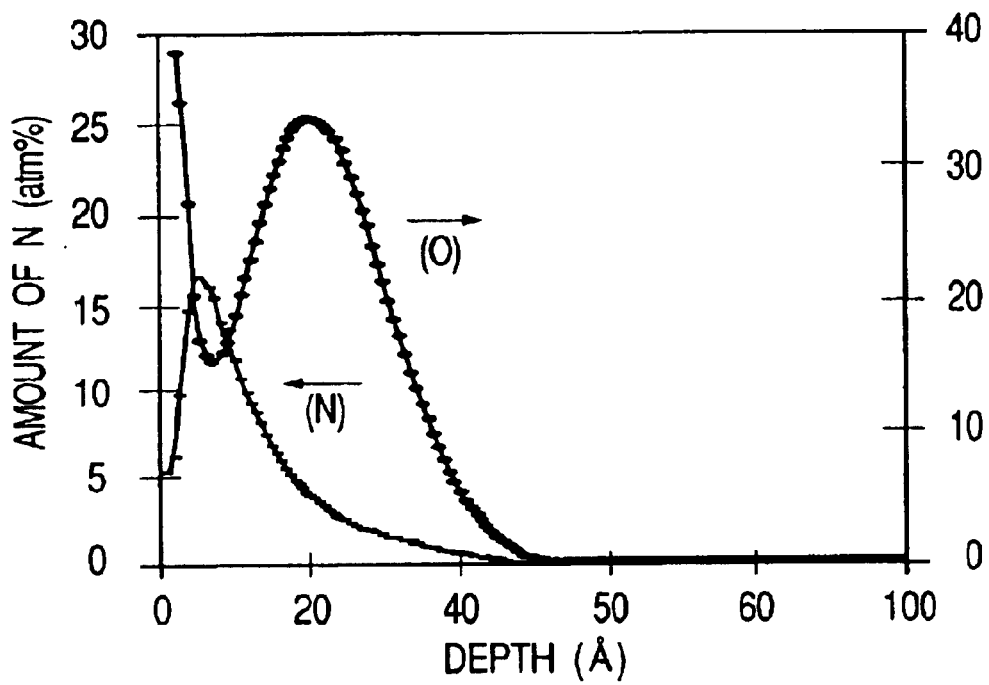
FIG. 35 is a diagram illustrating the distribution of the contained element in the direction of thickness of the insulating film formed by the film-forming device of FIG. 34.
Figure 36:
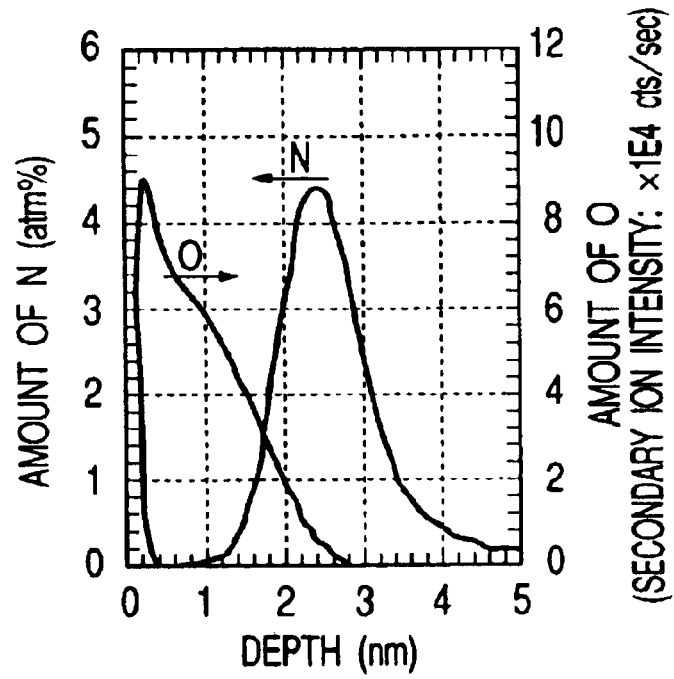
FIG. 36 is a diagram illustrating the distribution of the contained element in the direction of thickness of the insulating film formed by the heat-nitriding.

FIG. 34 illustrates a device used for reforming (plasma-nitriding or radical-nitriding) the silicon oxide film 6a. FIG. 34 shows an RPN (remote plasma nitriding) device 25. A nitrogen gas introduced into the device is converted into a plasma thereof through a plasma-generating unit 25a, and is fed onto the main surface of the semiconductor substrate 1 (semiconductor wafer) placed on a wafer stage 25b. Then, nitrogen radicals react with the insulating film (silicon oxide film 6a, etc) on the main surface of the semiconductor substrate to form a nitride film (nitride layer). FIG. 35 shows a profile of nitrogen in the film subjected to the RPN treatment by the SIMS (secondary ion mass spectrometry= secondary ion mass analysis)(R. Kraft, T. P. Schneider, W. W. Dostalik and S. Hattangady, J. Vac. Sci. Technol. B15(4), p. 967, July/August, 1997). For the purpose of comparison, FIG. 36 shows an SIMS profile of the nitride film using the nitrogen oxide (NO) gas. It will be understood from FIGS. 35 and 36 that when the RPN treatment is effected, the profiles of oxygen and nitrogen are reversed compared to the nitride film using NO, and nitrogen is distributed on the surface side. When this method is employed, a very thin nitride film can be easily formed. Further, since nitrogen and silicon oxide can be firmly bonded together, resistance is improved against the etching.

Embodiment 7

A method of forming the gate-insulating film of the MISFET according to another embodiment of the invention will be described with reference to FIGS. 37 to 40.

First, the threshold voltage control layer is formed in the same manner as in the embodiment 1 described with reference to FIGS. 16 to 18.

Figure 37:
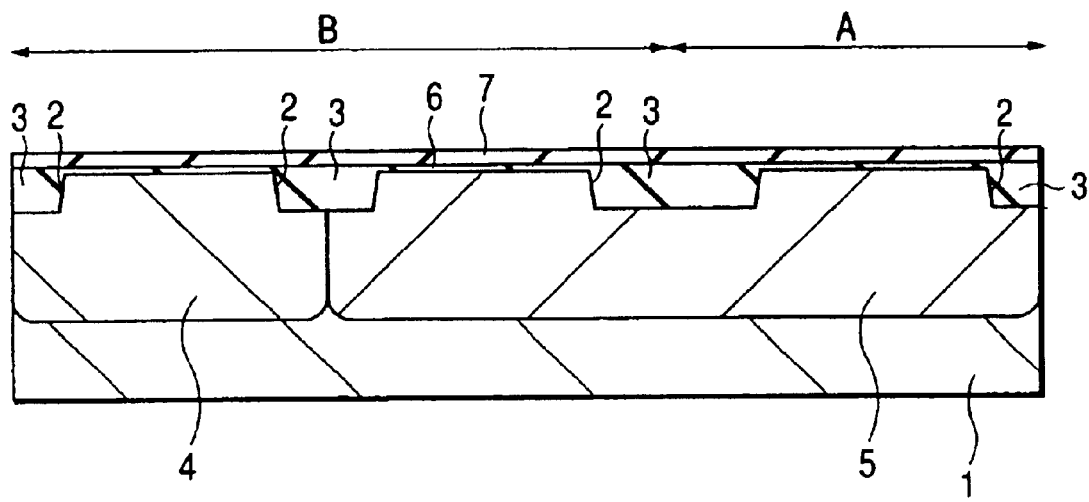
FIG. 37 is a sectional view of a major portion of a semiconductor substrate illustrating the method of forming a gate-insulating film of an MISFET according to a further embodiment of the invention.

Referring next to FIG. 37, the surface of the semiconductor substrate 1 is washed with an aqueous solution of hydrofluoric acid. Then, a silicon oxide film 6 is formed on the surface of the semiconductor substrate 1, and a silicon oxide film 7 is deposited as a protection film on the silicon oxide film 6 by the CVD method.

Figure 38:
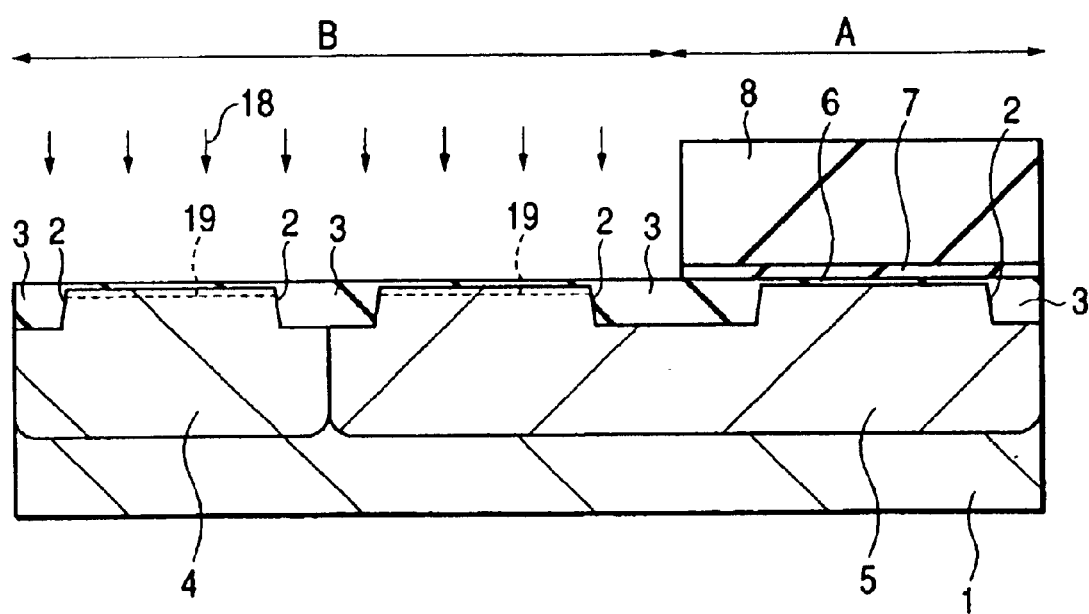
FIG. 38 is a sectional view of the major portion of the semiconductor substrate illustrating the method of forming the gate-insulating film of the MISFET according to a further embodiment of the invention.

Referring next to FIG. 38, the silicon oxide film 7 on the region B where the thin gate-insulating film is formed is chiefly etched with a bufferred hydrofluoric acid solution using the photoresist pattern 8 as a mask.

Next, impurities 18 for controlling the threshold voltage of the MISFET are injected into the semiconductor substrate 1 to form a channel layer 19. Here, the impurities 18 are injected in the same manner as those injected into the region where the n-channel MISFET is formed and those injected into the region where the p-channel MISFET is formed on the region B of forming the thin gate-insulating film. Therefore, these impurities play the role of counter-injection against the impurities injected for forming the threshold voltage control layer explained with reference to FIGS. 16 to 18.

Then, the silicon oxide 6 that had not been removed by the above etching is removed by using the bufferred hydrofluoric acid solution.

Figure 39:
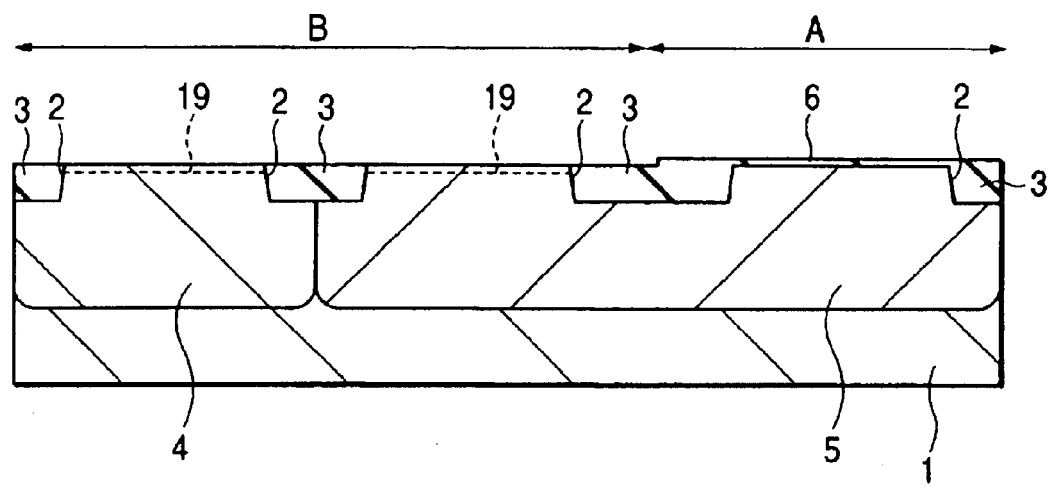
FIG. 39 is a sectional view of the major portion of the semiconductor substrate illustrating the method of forming the gate-insulating film of the MISFET according to a further embodiment of the invention.

Referring next to FIG. 39, the photoresist pattern 8 is removed followed by washing for about 5 minutes by using an aqueous solution of, for example, $NH_3:H_2O_2:H_2O=$ 2:5:100 heated at 70° C. Then, the silicon oxide film 7 is chiefly removed with a solution of hydrofluoric acid.

Figure 40:
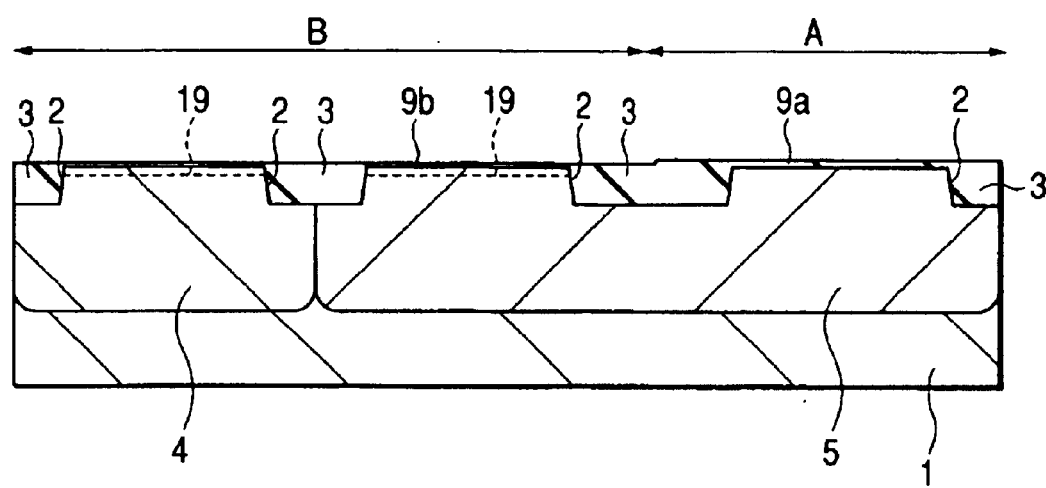
FIG. 40 is a sectional view of the major portion of the semiconductor substrate illustrating the method of forming the gate-insulating film of the MISFET according to a further embodiment of the invention.

Referring next to FIG. 40, the semiconductor substrate 1 is heat-oxidized to form a silicon oxide film 9a for constituting a thick gate-insulating film on the region A on where the silicon oxide film 6 has been formed, and to form a silicon oxide film 9b for constituting a thin gate-insulating film on the region B on where the surface of the semiconductor substrate 1 is being exposed.

Instead of forming the silicon oxide films 9a and 9b, there may be deposited a film of silicon oxide, a film of SiN, a film of $Ta_2O_5$ or a film of $TiO_2$ on the semiconductor substrate 1 by the CVD method. Prior to depositing these insulating films, further, the silicon oxide film may be deposited maintaining a thickness of about 1 nm as an underlying film by the heat treatment on the exposed surface of the semiconductor substrate 1.

Embodiment 8

Described below with reference to FIGS. 41 to 44 is the method of forming the gate-insulating film of the MISFET according to another embodiment of the invention.

First, the threshold voltage control layer is formed by the same method as the one explained in the embodiment 1 with reference to FIGS. 16 to 18.

Figure 41:
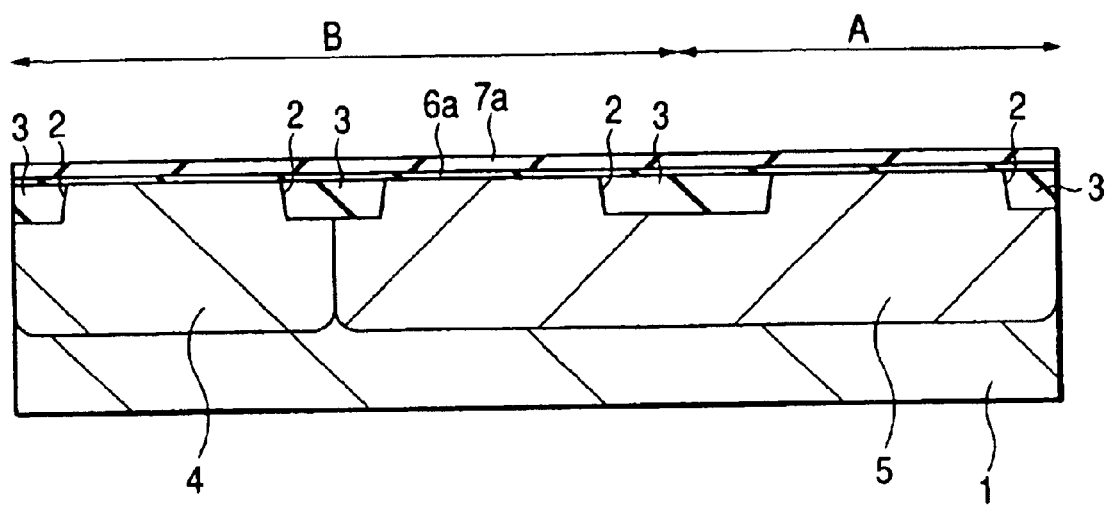
FIG. 41 is a sectional view of the major portion of the semiconductor substrate illustrating, the method of forming the gate-insulating film of the MISFET according to a further embodiment of the invention.

Referring next to FIG. 41, the surface of the semiconductor substrate 1 is washed with an aqueous solution of hydrofluoric acid and, then, a silicon oxide film 6a is deposited by the CVD method. In forming the silicon oxide film 6a, another silicon oxide film may be deposited maintaining a thickness of about 1 nm as an underlying film in order to prevent the infiltration of contamination into the semiconductor substrate 1 or to maintain favorable interfacial properties between the silicon oxide film 6a and the semiconductor substrate 1. Thereafter, a silicon oxide film 7a is deposited by the CVD method on the silicon oxide film 6a, the silicon oxide film 7a serving as a protection film and having a composition different from the silicon oxide film 6a.

Figure 42:
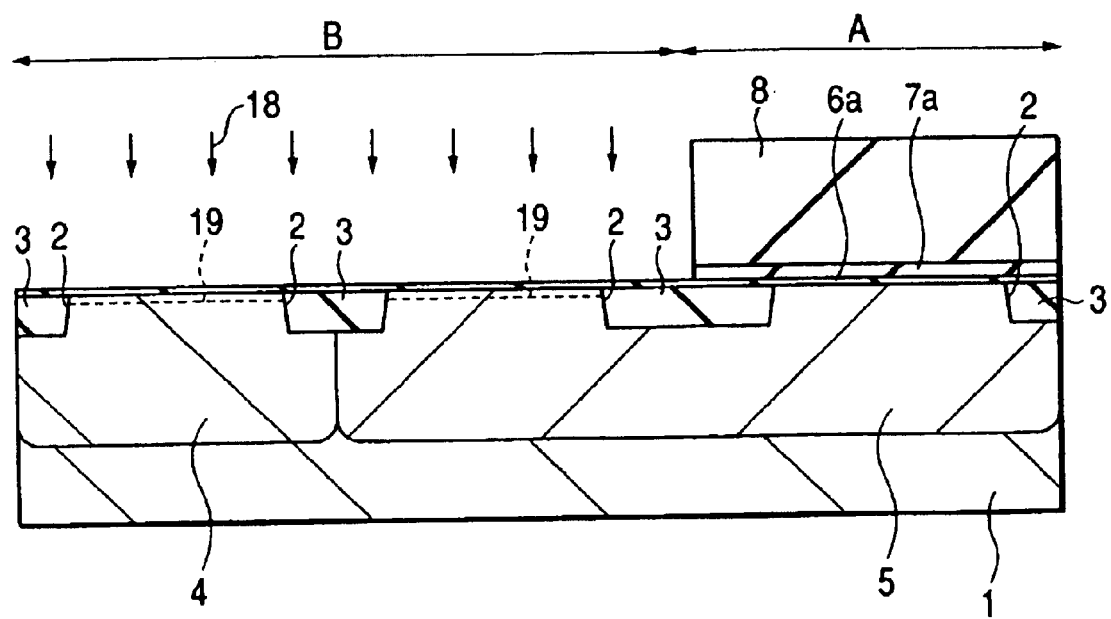
FIG. 42 is a sectional view of the major portion of the semiconductor substrate illustrating the method of forming the gate-insulating film of the MISFET according to a further embodiment of the invention.

Referring next to FIG. 42, the silicon oxide film 7a only is removed by etching from the region B on where a thin gate-insulating film is to be formed using the photoresist pattern 8 as a mask.

Next, impurities 18 for controlling the threshold voltage of the MISFET are injected into the semiconductor substrate 1 to form a channel layer 19. Here, the impurities 18 are injected in the same manner as those injected into the region where the n-channel MISFET is formed and those injected into the region where the p-channel MISFET is formed on the region B of forming the thin gate-insulating film. Therefore, these impurities play the role of counter-injection against the impurities injected for forming the threshold voltage control layer explained with reference to FIG. 1.

Then, the silicon oxide 6a that had not been removed by the above etching is removed by using the bufferred hydrofluoric acid solution.

Figure 43:
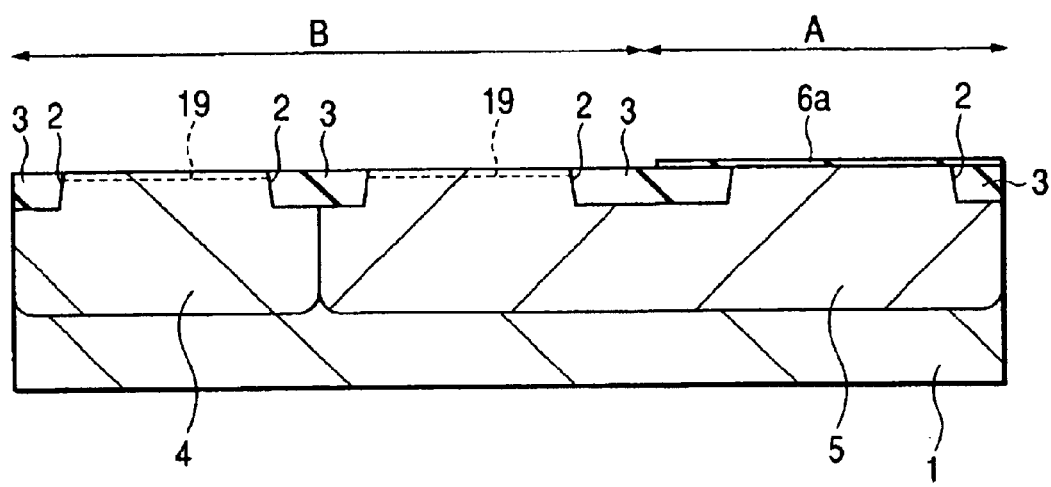
FIG. 43 is a sectional view of the major portion of the semiconductor substrate illustrating the method of forming the gate-insulating film of the MISFET according to a further embodiment of the invention.

Referring next to FIG. 43, the photoresist pattern 8 is removed followed by washing for about 5 minutes by using an aqueous solution of, for example, $NH_3:H_2O_2:H_2O=$ 2:5:100 heated at 70° C. Then, the silicon oxide film 7a is chiefly removed with a solution of hydrofluoric acid.

Figure 44:
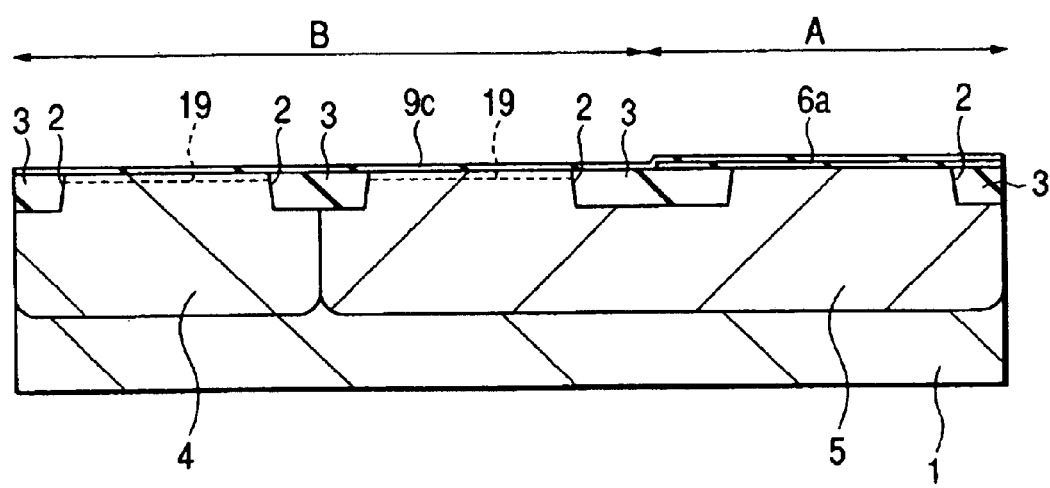
FIG. 44 is a sectional view of the major portion of the semiconductor substrate illustrating the method of forming the gate-insulating film of the MISFET according to a further embodiment of the invention.

Referring next to FIG. 44, an insulating film such as a film of SiN, a film of $Ta_2O_5$ or a film of $TiO_2$ is deposited on the semiconductor substrate 1 by the CVD method. Prior to depositing these insulating films, further, the silicon oxide film may be deposited maintaining a thickness of about 1 nm as an underlying film by heat-treating the exposed surface of the semiconductor substrate 1. Thus, a laminate of the silicon oxide film 6a and the above insulating film is formed on the region A where the thick gate-insulating film is to be formed and the above insulating film only is formed on the region B where the thin gate-insulating film is to be formed. Therefore, the following effects are obtained like in the above embodiment 4. This makes it easy to form the gate-insulating films. It is further allowed to suppress or prevent the flow of a gate current (tunnel current) between the gate electrode and the semiconductor substrate.

Embodiment 9

A further technical idea of the invention will be described next with reference to FIGS. 45(a) to 45(d).

Figure 45A:
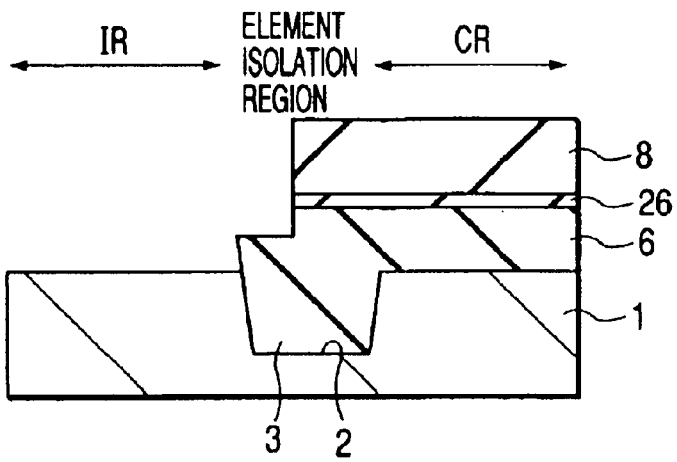
FIGS. 45(a) to 45(d) are sectional views of a major portion of a semiconductor substrate in the steps for manufacturing a semiconductor integrated circuit device for explaining a further technical idea of the invention.

First, as shown in FIG. 45(a), the semiconductor substrate 1 is heat-oxidized to form a silicon oxide film 6 on the main surface (active region) of the semiconductor substrate 1. Then, an insulating film 26 is deposited as a protection film on the silicon oxide film 6 in a manner of being directly contacted thereto. The insulating film 26 has an anti-oxidizing property and is not almost etched through the pre-washing (e.g., washing with hydrofluoric acid). Besides, the insulting film 26 is formed having a thickness smaller than that of the silicon oxide film 6.

Next, a photoresist pattern 8 is formed being directly contacted to the insulating film 26 covering the thick-film portion but exposing the thin-film portion. Then, the insulating film 26 and the silicon oxide film 6 are successively removed from the thin-film portion using the photoresist pattern 8 as an etching mask.

Figure 45B:
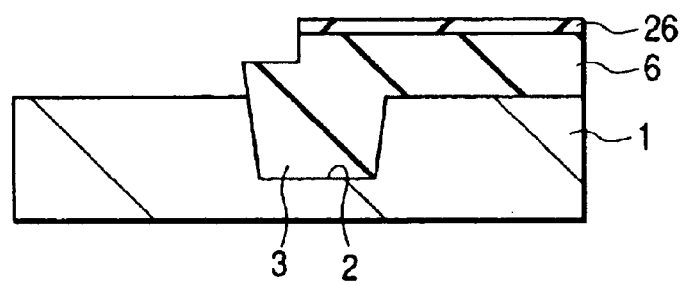

Thereafter, the photoresist pattern 8 is removed by ashing to obtain a sectional structure shown in FIG. 45(b). Here, since the insulating film 26 has been formed on the silicon oxide film 6 under the photoresist pattern 8, the silicon oxide film 6 is damaged little.

Next, the back surface of the semiconductor substrate 1 is washed. The washing of back surface includes, for example, a first washing and a second washing as described in the embodiment 1 above.

Figure 45C:
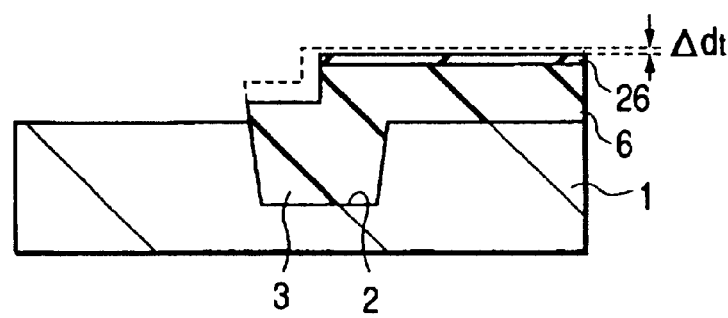

Then, the whole semiconductor substrate 1 inclusive of the main surface is subjected to the pre-washing in the same manner as in the process for forming two kinds of gate-insulating films studied by the present inventors as described above. FIG. 45(c) is a sectional view illustrating a major portion of the semiconductor substrate 1 after the pre-washing, wherein Δdt represents the amount by which the insulating film 26 is scraped. This eliminates the spontaneously oxidized film formed on the main surface of, for example, the thin-film portion of the semiconductor substrate 1 and to decrease or eliminate damage at the time of removing the photoresist film.

According to the technical idea of the invention, the insulating film 26 is not almost etched through the pre-washing (e.g., washing with hydrofluoric acid). This prevents weak spots in the silicon oxide film 6 from being exposed during the pre-washing, making it possible to secure the breakdown voltage of the gate-insulating film on the thick-film portion where a high breakdown voltage is required. The insulating film 26 works as a stopper during the pre-washing and, hence, the silicon oxide film 6 remains. This contributes to improving precision for setting the thickness of the silicon oxide film 6.

According to the technical idea of the invention, too, the silicon oxide film 6 on the thick-film portion is covered with the insulating film 26 which is the protection film and does not come into direct contact with the photoresist pattern 8 like in the above embodiment 1, making it possible to decrease or prevent the silicon oxide film 6 from being contaminated by the photoresist film. Like in the above embodiment 1, therefore, much attention needs not be given to the contamination of the silicon oxide film 6 by the photoresist film during the pre-washing.

Figure 45D:
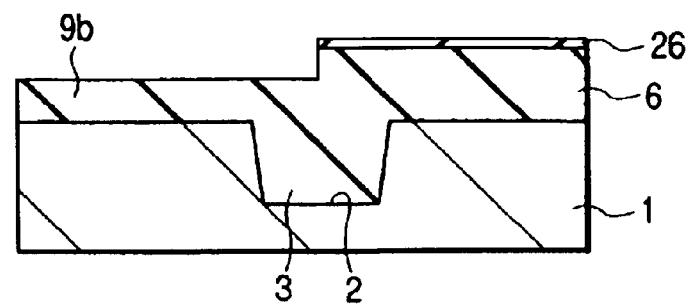

After the pre-washing, the semiconductor substrate 1 is subjected to the second heat oxidation to form a silicon oxide film 9b that constitutes a relatively thin gate-insulating film on the thin-film portion as shown in FIG. 45(d). Here, no film is formed since the insulating film 26 having anti-oxidizing property has been formed on the thick-film portion. Therefore, the relatively thick gate-insulating film on the thick-film portion is constituted by the silicon oxide film 6 and by the insulating film 26 formed thereon. Thereafter, a gate electrode is formed on the insulating film 26 and on the silicon oxide film 9b in the same manner as that of forming an ordinary field-effect transistor. Thus, the technical idea of the invention described above offers the same effect as that of the invention described in the above embodiment 1.

Next, described below is the case where the technical idea of the invention is applied to a method of manufacturing a semiconductor integrated circuit device having, for example, a CMIS (complementary metal insulator semiconductor) circuit.

Figure 46:
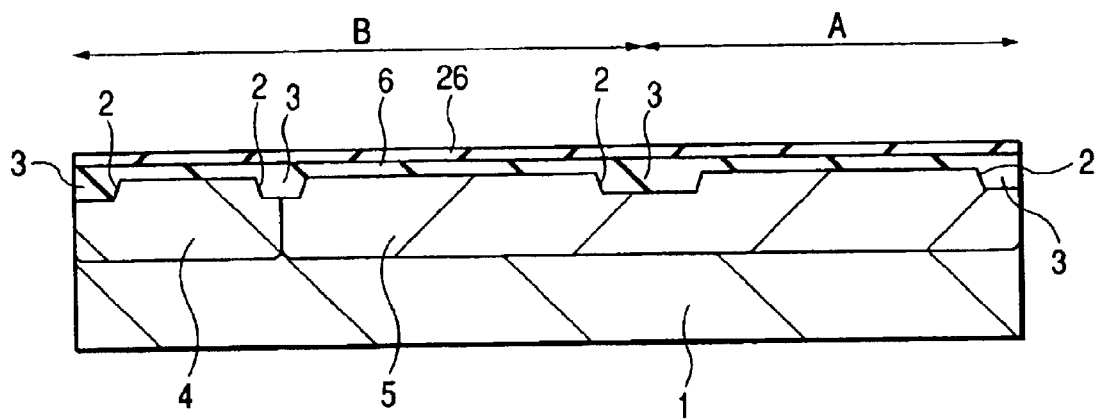
FIG. 46 is a sectional view of a major portion of the semiconductor substrate in a step of manufacturing the semiconductor integrated circuit device according to a further embodiment of the invention.

First, after the steps same as the steps of manufacturing the semiconductor integrated circuit device explained with reference to FIGS. 14 to 19 of embodiment 1, an insulating film 26 is formed as a protection film on the silicon oxide film 6 as shown in FIG. 46. The insulating film 26 is composed of a material having anti-oxidizing property and resistance against the washing, and is, for example, a silicon nitride film. The insulating film 26 has a thickness smaller than that of the silicon oxide film 6a, i.e., has a thickness of, for example, from about 0.5 to about 1.0 $\mu$m that is not removed through the pre-washing that will be described later. The insulating film 26 is formed by, for example, depositing an insulating film of silicon nitride on the silicon oxide film by the CVD method or JVD method, or by reforming the surface of the silicon oxide film 6 by the PRN treatment such as plasma-nitriding or radical-nitriding, or by the heat-nitriding. In the case of the reforming (particularly, when the PRN treatment is employed), a very thin insulating film 26 can be formed maintaining a high precision. Further, the insulating film 26 is formed in a state where nitrogen and the silicon oxide film are bonded together, featuring highly bonded state and large resistance against the etching.

Figure 47:
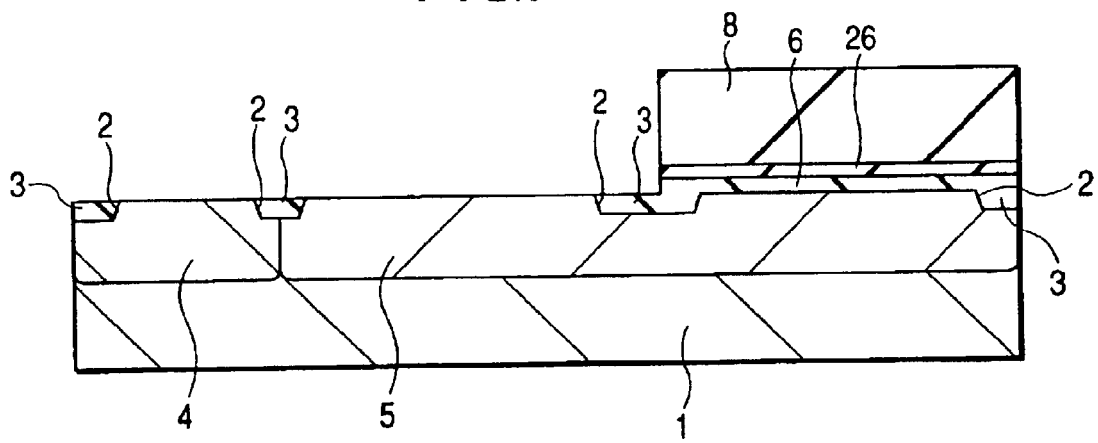
FIG. 47 is a sectional view of the major portion of the semiconductor substrate in a step of manufacturing the semiconductor integrated circuit device following FIG. 46.

Referring next to FIG. 47, a photoresist pattern 8 same as that of the embodiment 1 is formed on the insulating film 26 and is used as an etching mask to successively etch the insulating film 26 and the silicon oxide film 6 from the region B which is the thin-film portion. Thereafter, the photoresist pattern 8 is removed followed by the same pre-washing as that of the embodiment 1 to obtain a structure shown in FIG. 48. The insulating film 26 is not almost etched through the pre-washing. Therefore, the silicon oxide film 6 and the insulating film 26 are left on the region A which is the thick-film portion.

Figure 49:
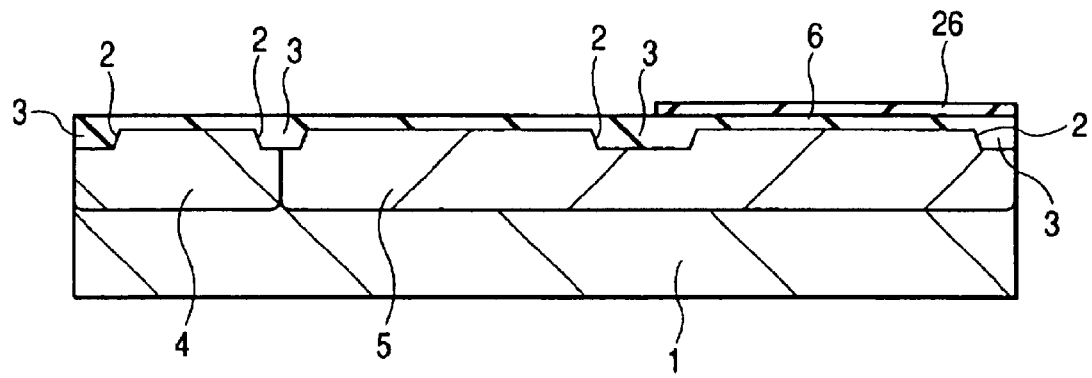
FIG. 49 is a sectional view of the major portion of the semiconductor substrate in a step of manufacturing the semiconductor integrated circuit device following FIG. 48.
Figure 50:
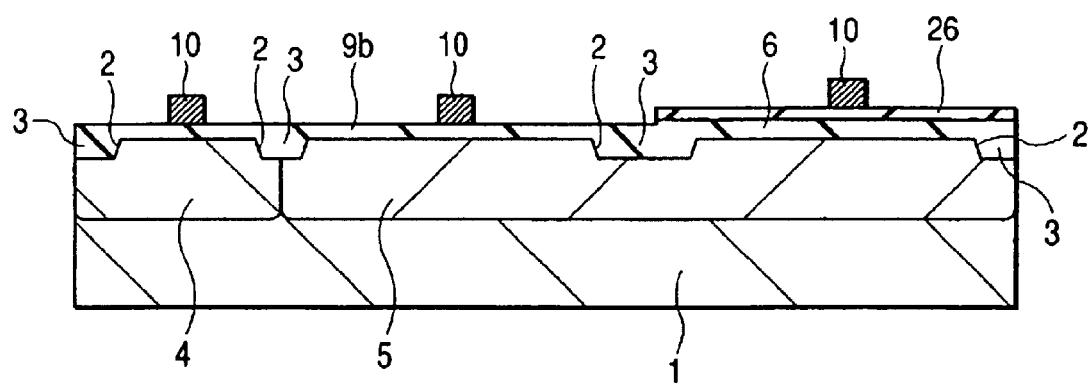
FIG. 50 is a sectional view of the major portion of the semiconductor substrate in a step of manufacturing the semiconductor integrated circuit device following FIG. 49.

Next, the semiconductor substrate 1 is heat-oxidized to form a silicon oxide film 9b on the main surface of the region B which is the thin-film portion of the semiconductor substrate 1 as shown in FIG. 49. No film is formed on the region A which is the thick-film portion since the insulating film 26 having a strong anti-oxidizing property has been formed thereon, and a laminate of the silicon oxide film 6 and the insulating film 26 is formed thereon. Referring next to FIG. 50, gate electrodes 10 are formed on the silicon oxide film 9b and on the insulating film 26 in the same manner as in the embodiment 1. The subsequent steps are the same as those of the embodiment 1 and are not described. In this embodiment 9, too, the insulating film 26 of silicon nitride is formed on the gate-insulating film on the region A which is the thick-film portion, exhibiting the following effects like those obtained in the above embodiment 4. This makes it easy to form the gate-insulating film on the thick-film portion. It is further allowed to suppress or prevent the flow of a gate current (tunnel current) between the gate electrode and the semiconductor substrate in the thick-film portion of the MISFET.

Embodiment 10

The embodiment 10 is a modification from the embodiment 9.

Figure 48:
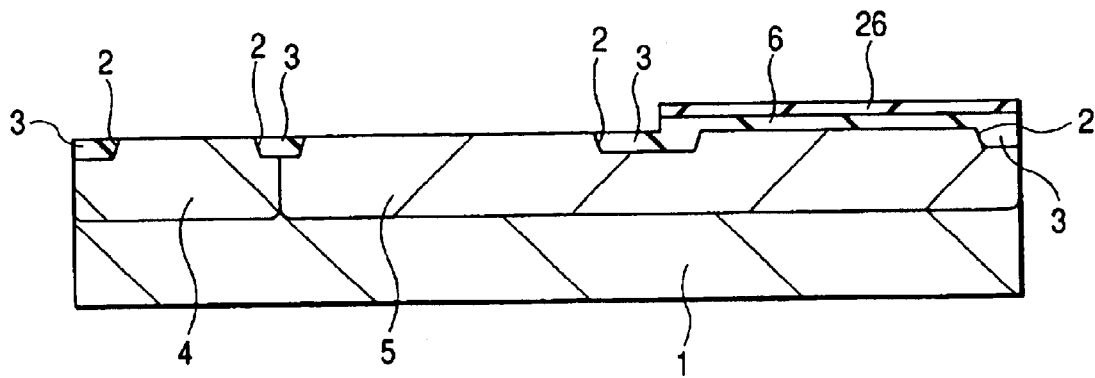
FIG. 48 is a sectional view of the major portion of the semiconductor substrate in a step of manufacturing the semiconductor integrated circuit device following FIG. 47.
Figure 51:
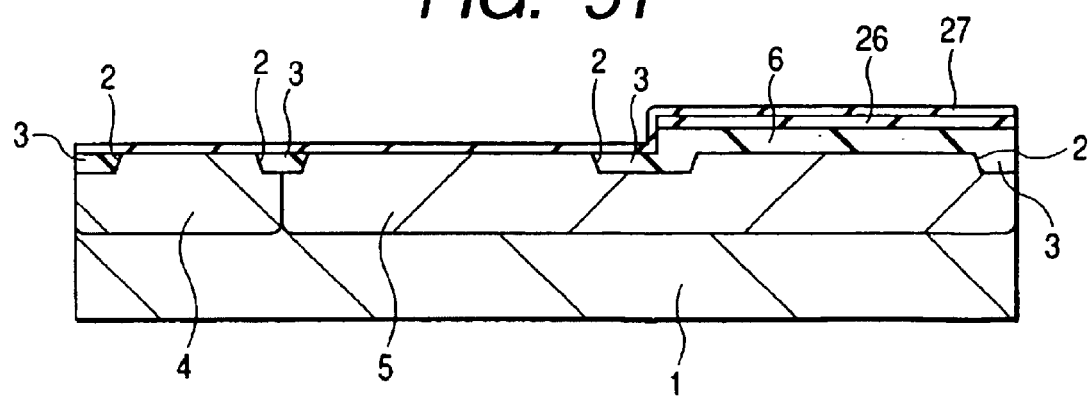
FIG. 51 is a sectional view of a major portion of a semiconductor substrate in a step of manufacturing a semiconductor integrated circuit device according to a still further embodiment of the invention.
Figure 52:
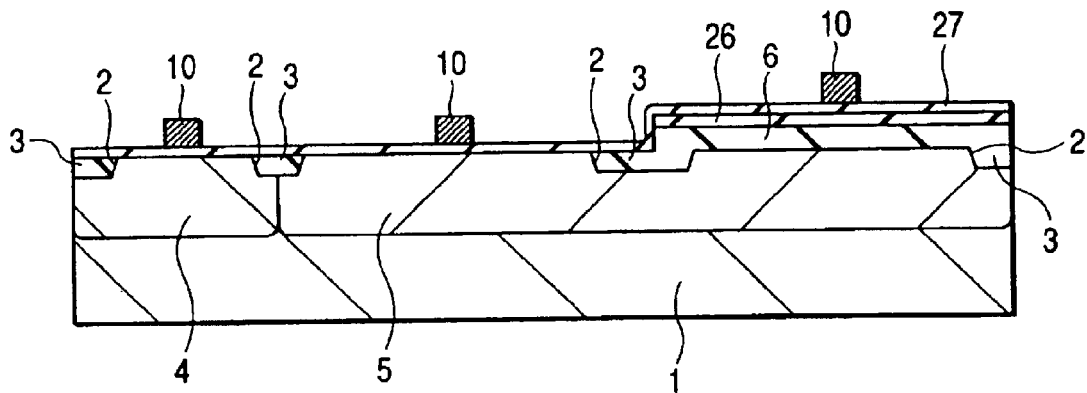
FIG. 52 is a sectional view of the major portion of the semiconductor substrate in a step of manufacturing the semiconductor integrated circuit device following FIG. 51.

First, after the steps of FIGS. 46 to 48, an insulating film 27 having a high dielectric constant is formed on the semiconductor substrate 1 as shown in FIG. 51. Thus, a gate-insulating film which is an insulating film 27 is formed on the region B which is the thin-film portion, and a gate-insulating film which is a laminate of the insulating film 27 formed on the silicon oxide film 6 via the insulating film 26, is formed on the region A which is the thick-film portion. The insulating film 27 is, for example, the one of silicon nitride formed by the CVD method, RPN method or JVD method like the insulating film 26, or is the one of tantalum oxide ($Ta_xO_y$: e.g., $Ta_2O_5$), titanium oxide ($TiO_x$: e.g., $TiO_2$) or SiON. The insulating film 27 hay have a thickness required for the gate-insulating film on the region B which is the thin-film portion. In this embodiment 10, the insulating film 27 has a high dielectric constant. Therefore, despite the thickness is not so small, the MISFET exhibits performance comparable to that of when the silicon oxide film 9b (see FIG. 49) has a small thickness. It is therefore allowed to form the gate-insulating films maintaining relatively large thicknesses on the region A which is the thick-film portion and on the region B which is the thin-film portion, enabling the film thicknesses to be easily controlled like in the embodiment 4. It is further allowed to suppress or prevent the leakage current between the gate electrode and the semiconductor substrate. Then, as shown in FIG. 52, gate electrodes 10 are formed on the insulating film 27 on the region A which is the thick-film portion and on the region B which is the thin-film portion like in the embodiment 1. The subsequent steps are the same as those of the embodiment 1 and are not described.

Embodiment 11

The embodiment 11 deals with a modification of the gate electrodes of the MISFET, i.e., deals with a method of forming a so-called dual gate-polymetal gate electrode structure, and can be applied to any one of the embodiments 1 to 10.

Figure 53:
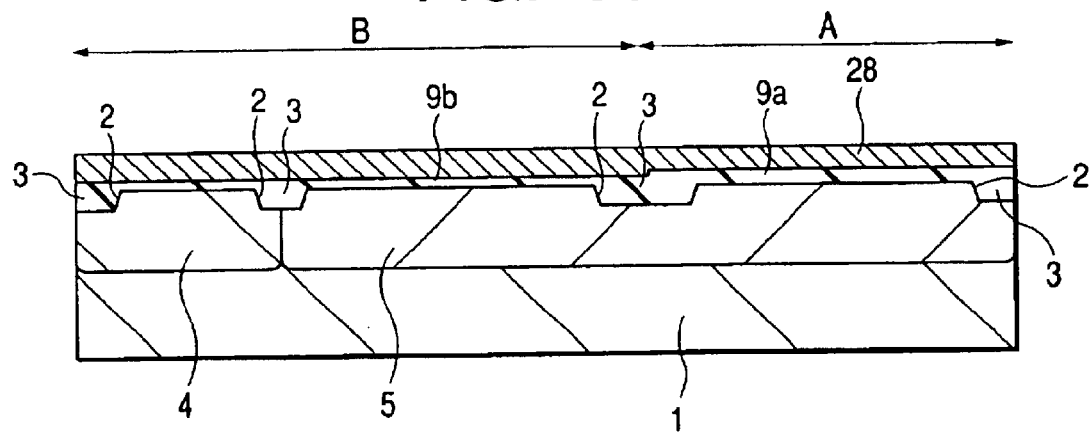
FIG. 53 is a sectional view of a major portion of the semiconductor substrate in a step of manufacturing a semiconductor integrated circuit device according to a yet further embodiment of the invention.
Figure 54:
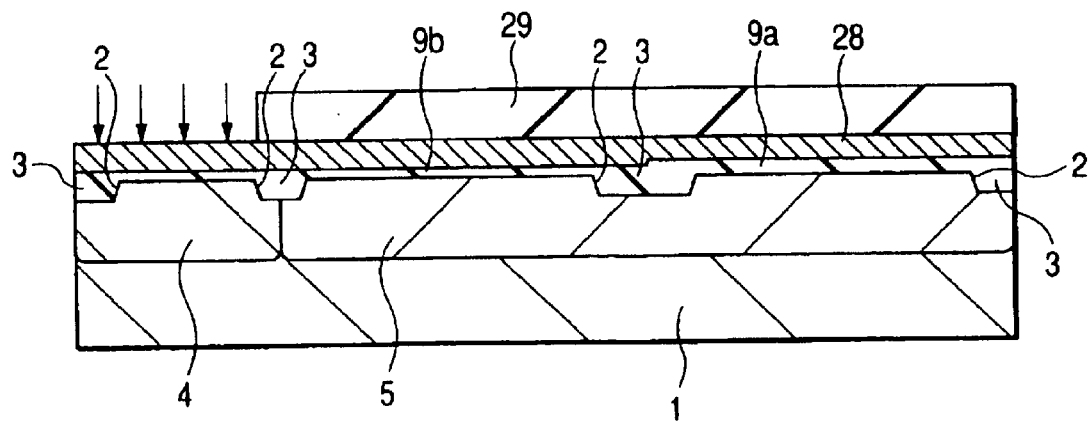
FIG. 54 is a sectional view of the major portion of the semiconductor substrate in a step of manufacturing the semiconductor integrated circuit device following FIG. 53.
Figure 55:
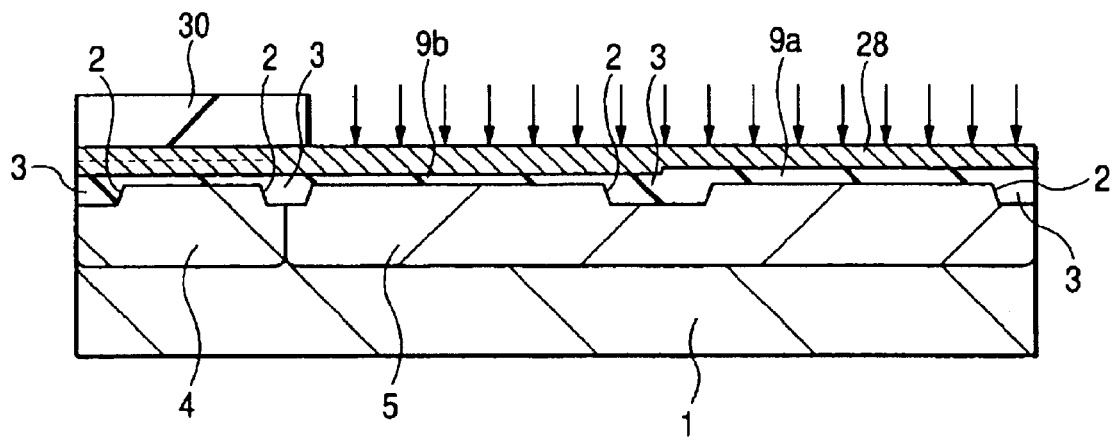
FIG. 55 is a sectional view of the major portion of the semiconductor substrate in a step of manufacturing the semiconductor integrated circuit device following FIG. 54.

First, after the steps same as those of the embodiment 1 shown in FIGS. 14 to 23, a polycrystalline silicon film 28 is deposited by the CVD method on the main surface of the semiconductor substrate 1 as shown in FIG. 53. Referring next to FIG. 54, a photoresist pattern 29 is so formed on the polycrystalline silicon film 28 as to expose the region where the n-channel MISFET is to be formed but to cover other regions. By using the photoresist pattern 29 as a mask, impurities such as P (phosphorus) ions are injected into a portion of the polycrystalline silicon film 28 that is not covered by the photoresist pattern 29. Thus, the portion of the polycrystalline silicon film 28 on the p-type well 4 assumes the $n^-$-type. Then, after the photoresist pattern 29 is removed, a photoresist pattern 30 is formed on the polycrystalline silicon film 28 permitting the p-channel MISFET-forming region to be exposed but covering other regions as shown in FIG. 55. Then, by using the photoresist pattern 30 as a mask, impurities such as B (boron) ions are injected into a portion of the polycrystalline silicon film 28 that is not covered by the photoresist pattern 30. Thus, the portion of the polycrystalline silicon film 28 on the n-type well assumes the $p^+$-type.

Figure 56:
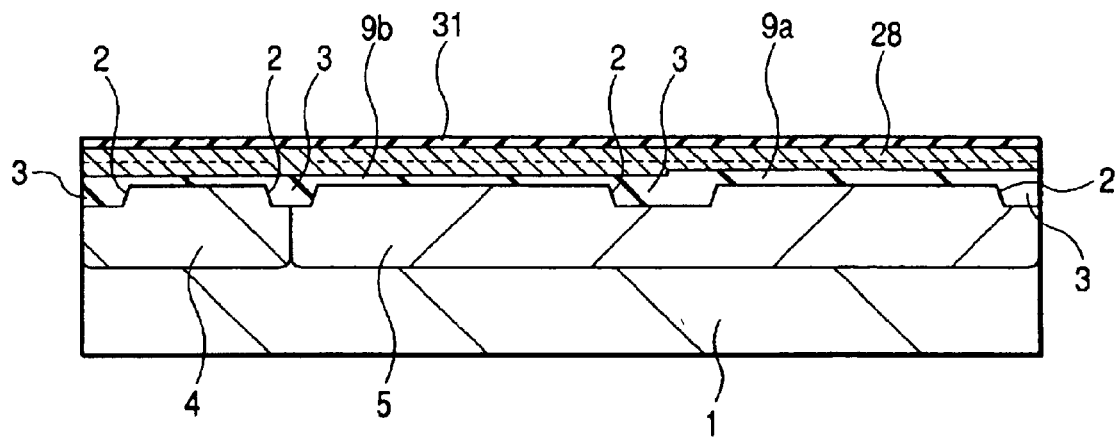
FIG. 56 is a sectional view of the major portion of the semiconductor substrate in a step of manufacturing the semiconductor integrated circuit device following FIG. 55.
Figure 57:
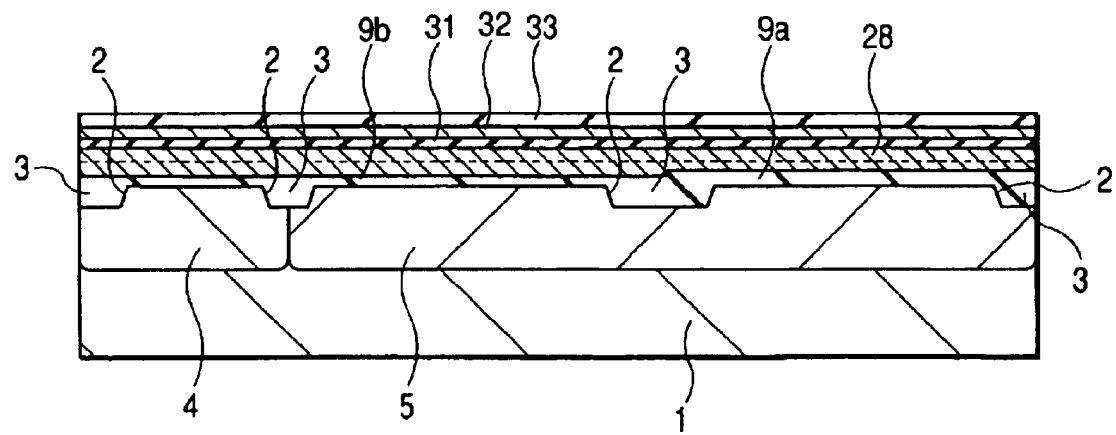
FIG. 57 is a sectional view of the major portion of the semiconductor substrate in a step of manufacturing the semiconductor integrated circuit device following FIG. 56.

Referring next to FIG. 56, an electrically conducting film 31 such as of tungsten nitride or titanium nitride is deposited by sputtering on the polycrstalline silicon film 28 and, then, as shown in FIG. 57, an electrically conducting film 32 of tungsten or the like is deposited thereon by sputtering. Further, an insulating film 33 for a cap comprising, for example, a silicon oxide film or a silicon nitride film is deposited thereon by the CVD method. The electrically conducting film 31 suppresses the formation of a silicide layer that results from the reaction of tungsten in the electrically conducting film 32 with silicon in the polycrystalline silicon film 28. Then, the polycrystalline silicon film 28, the electrically conducting films 31 and 32 and the insulating film 33 for cap are patterned by the photolithography technology and dry-etching technology, in order to form the gate electrode 10 and the insulating film 33 for cap thereon in the same manner as in the embodiment 1. The subsequent steps are the same as those of the embodiment 1 and are not described.

This embodiment 11, too, exhibits the same effect as that of the embodiments 1 to 10. In particular, the following effect is obtained when the gate electrode structure of this embodiment 11 is applied to the above embodiments 5, 9 and 10. That is, in the embodiment 5, the nitride film (nitride layer) is formed on the gate-insulating films of MISFETs in the thick-film portion and in the thin-film portion. In the embodiments 9 and 10, further, the gate-insulating film of the MISFET on the thick-film portion is constituted by a laminate of the silicon oxide film 6 on which are deposited insulating films 26 and 27 of silicon nitride (see FIGS. 50 and 52). Accordingly, the nitride layers or the insulating films 26 and 27 suppress or prevent boron ions having a high diffusion coefficient in the gate electrodes 10 from being diffused to the side of the silicon oxide film. This makes it possible to improve operation reliability and yield of the p-channel MISFETs.

In the foregoing was concretely described the invention accomplished by the present inventors by way of embodiments. It should, however, be noted that the invention is in no way limited to the above-mentioned embodiments only but can be modified in a variety of other ways without departing from the gist and scope of the invention.

The above embodiments 1 to 11 have dealt with the case where the invention was adapted to the semiconductor integrated circuit device having, for example, a CMIS circuit and to the DRAM. Not being limited thereto only, however, the invention can be adapted to a semiconductor device having a memory circuit, such as SRAM (static random access memory) or flush memory (EEPROM: electric erasable programmable read-only memory), to a semiconductor device having a logic circuit, such as microprocessor, and to a hybrid semiconductor device having the memory circuit and the logic circuit formed in the same semiconductor substrate.

Briefly described below are effects obtained by representative examples of the invention disclosed in this application.

According to the invention, a plurality of kinds of gate-insulating films having dissimilar thicknesses are formed without causing contamination from the resist film, avoiding damage in the step of removing the resist and in the subsequent step of washing and, hence, without deteriorating the breakdown voltage of the gate-insulating films. Further, the interface level is lowered to stabilize the operation characteristics of the MISFET, contributing to improving reliability of the MISFET having a plurality of kinds of gate-insulating films of dissimilar thicknesses.

According to the invention, further, the thicknesses of the gate-insulating films are favorably controlled, and the production yields of MISFETs can be enhanced.

What is claimed is:

1. A method of manufacturing a semiconductor integrated circuit device, comprising the steps of:
   (a) forming a first insulating film on the surface of a semiconductor substrate having a first active region and a second active region;
   (b) forming a protection film on said first insulating film;
   (c) successively removing said protection film and said first insulating film from said second active region;
   (d) cleaning said semiconductor substrate after said step (c); and
   (e) forming a second insulating film on said semiconductor substrate after said step (d) to form an insulating film of a first relatively large thickness on said first active region and to form an insulating film of a second relatively small thickness on said second active region, wherein said protective film is removed from said first active region in said step (d).

2. A method of manufacturing a semiconductor integrated circuit device according to claim 1, wherein in effecting said cleaning in said step (d), the rate for etching said protection film is larger than the rate for etching said first insulating film, and said first insulating film is removed from said second active region.

3. A method of manufacturing a semiconductor integrated circuit device according to claim 1, wherein the amount of reduction of the thickness of said first insulating film in said step (d) is not more than 1 nm.

4. A method of manufacturing a semiconductor integrated circuit device according to claim 3, wherein the amount of reduction of the thickness of said first insulating film in said step (d) is from 0.2 to 0.4 nm.

5. A method of manufacturing a semiconductor integrated circuit device according to claim 1, wherein said second insulating film is formed by a chemical vapor-phase deposition method.

6. A method of manufacturing a semiconductor integrated circuit device according to claim 1, wherein the insulating film having said first thickness and the insulating film having said second thickness work as gate-insulating films of the MISFET.

7. A method of manufacturing a semiconductor integrated circuit device according to claim 1, wherein in said step of cleaning, said protection film works to suppress the scraping of said first insulating film.

8. A method of manufacturing a semiconductor integrated circuit device according to claim 1, wherein said protection film is formed by the chemical vapor-phase deposition method.

9. A method of manufacturing a semiconductor integrated circuit device according to claim 1, wherein said second insulating film has a dielectric constant larger than that of said first insulating film.

10. A method of manufacturing a semiconductor integrated circuit device according to claim 1, wherein said first insulating film is formed by a chemical vapor-phase deposition method.

11. A method of manufacturing a semiconductor integrated circuit device according to claim 1, wherein said first insulating film is formed by a thermal oxidation method in said step (a),
   wherein said second insulating film is formed by a thermal oxidation method in said step (e), and
   wherein said protection film is formed by a chemical vapor-phase deposition method in said step (b).

12. A method of manufacturing a semiconductor integrated circuit device, comprising steps of:
   (a) forming a first insulating film on a main surface of a semiconductor substrate having a first active region and a second active region;
   (b) forming a protection film on said first insulating film;
   (c) covering said first active region with a masking pattern;
   (d) removing said protection film and said first insulating film from said second active region by using said masking pattern as a mask;
   (e) after said step (d), cleaning said semiconductor substrate; and (f) after said step (e), forming a second insulating film, on said second active region, having a film thickness thinner than that of said first insulating film, wherein in said step (e) a rate for etching said protection film is larger than a rate for etching said first insulating film such that said protection film is removed from said second active region, wherein said first insulating film serves as a gate insulating film of a first MISFET formed on said first active region, and wherein said second insulating film serves as a gate insulating film of a second MISFET formed on said second active region.

13. A method of manufacturing a semiconductor integrated circuit device according to claim 12, wherein in said step (e) an amount of reduction of a thickness of said first insulating film is not more than 1 nm.

14. A method of manufacturing a semiconductor integrated circuit device according to claim 12, wherein in said step of cleaning, said protection film works to suppress the scraping of said first insulating film.

15. A method of manufacturing a semiconductor integrated circuit device according to claim 12, wherein said second insulating film has a dielectric constant larger than that of said first insulating film.

16. A method of manufacturing a semiconductor integrated circuit device according to claim 12, wherein said second insulating film is formed by a chemical vapor-phase deposition method.

17. A method of manufacturing a semiconductor integrated circuit device according to claim 12, wherein said first insulating film is formed by a chemical vapor-phase deposition method.

18. A method of manufacturing a semiconductor integrated circuit device according to claim 12, wherein said first insulating film is formed by a thermal oxidation method in said step (a), wherein said second insulating film is formed by a thermal oxidation method in said step (f), and wherein said protection film is formed by a chemical vapor-phase deposition method in said step (b).

19. A method of manufacturing a semiconductor integrated circuit device comprising steps of:

(a) forming a first insulating film on a main surface of a semiconductor substrate having a first active region and a second active region;

(b) forming a protection film on said first insulating film;

(c) selectively removing said protection film and said first insulating film from said second active region, (d) after said step (c), cleaning said semiconductor substrate; and (e) after said step (d), forming a second insulating film, on said second active region, having a film thickness thinner than that of said first insulating film, wherein in said step (d) a rate for etching said protection film is larger than a rate for etching said first insulating film such that said protection film is removed from said second active region, wherein said first insulating film serves as a gate insulating film of a first MISFET formed on said first active region, and wherein said second insulating film serves as a gate insulating film of a second MISFET formed on said second active region.

20. A method of manufacturing a semiconductor integrated circuit device according to claim 19, wherein in said step (e) an amount of reduction of a thickness of said first insulating film is not more than 1 nm.

21. A method of manufacturing a semiconductor integrated circuit device according to claim 19, wherein said first insulating film is formed by a thermal oxidation method in said step (a), wherein said second insulating film is formed by a thermal oxidation method in said step (e), and wherein said protection film is formed by a chemical vapor-phase deposition method in said step (b).

22. A method of manufacturing a semiconductor integrated circuit device, comprising steps of:

(a) forming a first insulating film on a main surface of a semiconductor substrate having a first active region and a second active region;

(b) forming a protection film on said first insulating film;

(c) selectively removing said protection film and said first insulating film from said second active region;

(d) after said step (c), cleaning said semiconductor substrate such that said protection film is removed from said second active region; and (e) after said step (d), forming a second insulating film, on said second active region, having a film thickness thinner than that of said first insulating film, wherein said first insulating film serves as a gate insulating film of a first MISFET formed on said first active region, and wherein said second insulating film serves as a gate insulating film of a second MISFET formed on said second active region.

23. A method of manufacturing a semiconductor integrated circuit device according to claim 22, wherein said first insulating film is formed by a thermal oxidation method in said step (a), wherein said second insulating film is formed by a thermal oxidation method in said step (e), and wherein said protection film is formed by a chemical vapor-phase deposition method in said step (b).

24. A method of manufacturing a semiconductor integrated circuit device according to claim 22, wherein said second insulating film has a dielectric constant larger than that of said first insulating film.

25. A method of manufacturing a semiconductor integrated circuit device according to claim 22, wherein in said step (d) an amount of reduction of a thickness of said first insulating film is not more than 1 nm.

* * * * *